(12) United States Patent
Hanawa et al.

(10) Patent No.: US 8,097,482 B2
(45) Date of Patent: Jan. 17, 2012

(54) METHOD FOR MANUFACTURING GROUP III NITRIDE SEMICONDUCTOR, METHOD FOR MANUFACTURING GROUP III NITRIDE SEMICONDUCTOR LIGHT-EMITTING DEVICE, GROUP III NITRIDE SEMICONDUCTOR LIGHT-EMITTING DEVICE, AND LAMP

(75) Inventors: Kenzo Hanawa, Ichihara (JP);
Yasumasa Sasaki, Kamakura (JP);
Hisayuki Miki, Chiba (JP)

(73) Assignee: Showa Denko K.K, Tokyo (JP)

( * ) Notice: Subject to any disclaimer, the term of this patent is extended or adjusted under 35 U.S.C. 154(b) by 365 days.

(21) Appl. No.: 12/438,047

(22) PCT Filed: Jun. 3, 2008

(86) PCT No.: PCT/JP2008/060206
§ 371 (c)(1),
(2), (4) Date: Feb. 19, 2009

(87) PCT Pub. No.: WO2008/152944
PCT Pub. Date: Dec. 18, 2008

(65) Prior Publication Data
US 2010/0244086 A1   Sep. 30, 2010

(30) Foreign Application Priority Data

Jun. 11, 2007 (JP) .................................. 2007-154015

(51) Int. Cl.
*H01L 21/00* (2006.01)
*H01L 33/00* (2010.01)

(52) U.S. Cl. .......... 438/46; 438/604; 257/103; 257/201; 257/615; 257/E33.023; 257/E33.025; 257/E29.089

(58) Field of Classification Search ........................ None
See application file for complete search history.

(56) References Cited

U.S. PATENT DOCUMENTS

| | | | |
|---|---|---|---|
| 5,091,018 A * | 2/1992 | Fraas et al. | 136/246 |
| 5,811,319 A | 9/1998 | Koike et al. | |
| 6,117,700 A | 9/2000 | Orita et al. | |
| 6,204,084 B1 * | 3/2001 | Sugiura et al. | 438/46 |
| 6,713,789 B1 | 3/2004 | Shibata et al. | |
| 6,830,949 B2 * | 12/2004 | Senda et al. | 438/46 |
| 7,749,785 B2 * | 7/2010 | Miki et al. | 438/43 |
| 2004/0079949 A1 * | 4/2004 | Chiyo et al. | 257/79 |
| 2004/0118451 A1 * | 6/2004 | Walukiewicz et al. | 136/262 |
| 2009/0315046 A1 * | 12/2009 | Miki et al. | 257/94 |

(Continued)

FOREIGN PATENT DOCUMENTS

JP        60-039819 A       3/1985

(Continued)

*Primary Examiner* — Alonzo Chambliss
(74) *Attorney, Agent, or Firm* — Sughrue Mion, PLLC

(57) ABSTRACT

A method for manufacturing a Group III nitride semiconductor of the present invention, comprising a sputtering step for disposing a substrate and a target in a chamber and forming a Mg-doped Group III nitride semiconductor on the substrate by a reactive sputtering method, wherein the sputtering step includes respective substeps of: a film formation step for forming a semiconductor thin film while doping with Mg; and a plasma treatment step for applying an inert gas plasma treatment to the semiconductor thin film that has been formed in the film formation step, and the Group III nitride semiconductor is formed by laminating the semiconductor thin film through alternate repetitions of the film formation step and the plasma treatment step.

21 Claims, 5 Drawing Sheets

U.S. PATENT DOCUMENTS

| | | |
|---|---|---|
| 2010/0065855 A1* | 3/2010 | Yokoyama et al. ............ 257/76 |
| 2010/0261308 A1* | 10/2010 | Ikenoue et al. ................ 438/94 |
| 2010/0301379 A1* | 12/2010 | Yokoyama et al. ........... 257/103 |
| 2011/0163350 A1* | 7/2011 | Yokoyama et al. ........... 257/100 |

FOREIGN PATENT DOCUMENTS

| | | | |
|---|---|---|---|
| JP | 05-086646 | B2 | 12/1993 |
| JP | 07-263749 | A | 10/1995 |
| JP | 08-181073 | A | 7/1996 |
| JP | 08-264478 | A | 10/1996 |
| JP | 2000-216164 | A | 8/2000 |
| JP | 3440873 | B2 | 6/2003 |
| JP | 3700492 | B2 | 7/2005 |

\* cited by examiner

METHOD FOR MANUFACTURING GROUP III NITRIDE SEMICONDUCTOR, METHOD FOR MANUFACTURING GROUP III NITRIDE SEMICONDUCTOR LIGHT-EMITTING DEVICE, GROUP III NITRIDE SEMICONDUCTOR LIGHT-EMITTING DEVICE, AND LAMP

TECHNICAL FIELD

The present invention relates to a method for manufacturing a Group III nitride semiconductor which is suitably used for a light emitting diode (LED), a laser diode (LD), an electronic device, and the like, and represented by the general formula $Al_aGa_bIn_cN$ ($0 \leq a \leq 1$, $0 \leq b \leq 1$, $0 \leq c \leq 1$, and $a+b+c=1$), and particularly to a method for manufacturing a Group III nitride semiconductor for formation of a magnesium (Mg)-doped p-type Group III nitride semiconductor layer, a method for manufacturing a Group III nitride semiconductor light-emitting device, a Group III nitride semiconductor light-emitting device, and a lamp.

Priority is claimed on Japanese Patent Application No. 2007-154015, filed Jun. 11, 2007, the content of which is incorporated herein by reference.

BACKGROUND ART

Group III nitride semiconductors offer a direct transition over a band gap energy from visible light to ultraviolet rays, and excel in the light emission efficiency, and thus have been manufactured as semiconductor light-emitting devices such as a light emitting diode (LED) and a laser diode (LD) for use in various applications. In addition, when used for an electronic device, Group III nitride semiconductors have a potential to provide electronic devices having characteristics superior to those using conventional Group III-V compound semiconductors.

Such Group III nitride compound semiconductors are, in general, produced from trimethyl gallium, trimethyl aluminum, and ammonia as raw materials through a Metal Organic Chemical Vapor Deposition (MOCVD) method. The MOCVD method is a method in which a vapor of a raw material is introduced into a carrier gas to convey the vapor to the surface of a substrate and decompose the raw material on the surface of the heated substrate, to thereby grow a crystal.

Hitherto, a single crystal wafer of a Group III nitride semiconductor has not been commercially available, and Group III nitride semiconductors are, in general, produced by growing a crystal on a single crystal wafer of a different material. There is a large lattice mismatching between such a different kind of substrate and a Group III nitride semiconductor crystal to be epitaxially grown thereon. For example, when gallium nitride (GaN) is grown on a sapphire ($Al_2O_3$) substrate, there is a lattice mismatching of 16% therebetween, and when gallium nitride is grown on a SiC substrate, there is a lattice mismatching of 6% therebetween. In general, a large lattice mismatching as in the above leads to a problem in that it is difficult to epitaxially grow a crystal directly on a substrate, or a crystal, even if grown, can not gain excellent crystallinity.

Thus, for epitaxially growing a Group III nitride semiconductor crystal on a single crystal sapphire substrate or a single crystal SiC substrate through a Metal Organic Chemical Vapor Deposition (MOCVD) method, a method has been proposed and generally performed in which, firstly, a layer called a low temperature buffer layer made of aluminum nitride (AlN) or aluminum nitride gallium (AlGaN) is laminated on a substrate, and then a Group III nitride semiconductor crystal is epitaxially grown thereon at a high temperature.

In addition, regarding a method in which a layer of such as AlN is formed as a barrier layer on a substrate by a method other than the MOCVD method, and another layer is formed thereon by a MOCVD method, a method has been proposed in which a buffer layer is formed by high frequency sputtering, and a crystal having the same composition is grown thereon by a MOCVD method (for example, Patent Document 1).

However, the method disclosed in Patent Document 1 has a problem in that an excellent crystal cannot be stably produced.

Thus, in order to stably produce an excellent crystal, for example, there have been proposed a method for annealing a buffer layer in a mixed gas made of ammonia and hydrogen on completion of its growth (for example Patent Document 2), and a method for forming a buffer layer by DC sputtering at a temperature of 400° C. or higher (for example Patent document 3).

On the other hand, research has been conducted on the manufacture of a Group III nitride semiconductor crystal by sputtering. For example, with a purpose of laminating high resistance GaN, a method for forming a GaN film directly on a substrate made of sapphire by a sputtering method has been proposed (for example, Patent Document 4).

In addition, there is a method in which reverse sputtering is conducted with use of Ar gas as a pretreatment on a semiconductor layer for forming an electrode on the semiconductor layer (for example, Patent Document 5). According to the method described in Patent Document 5, the electrical contact resistance characteristic between the semiconductor layer and the electrode can be improved by applying reverse sputtering to the surface of the Group III nitride compound semiconductor layer.

For forming a film of GaN which is doped with Mg as an acceptor impurity on a substrate with use of a sputtering method as mentioned above, hydrogen ($H_2$) circulation into the atmosphere gas in a chamber makes it possible to form a GaN film with excellent crystallinity. However, hydrogen atoms (H) constituting the hydrogen gas are easily bonded with Mg, which brings about a problem regarding reduction in the dopant (Mg) carrier concentration.

Moreover, when a GaN crystal film is formed by a MOCVD method, ammonia gas ($NH_3$) is generally used as an N (nitrogen) source. Therefore, in this case, hydrogen is mixed into the crystal film. Thus, a method has been employed in which hydrogen emission from the GaN crystal is induced by a method called an activation annealing process which performs an annealing treatment at a temperature of 600° C. or higher in an inert gas. However, in the structure of a Group III nitride semiconductor light-emitting device such as an LED, if annealing is performed, the annealing heat brings about a problem of damaging the light-emitting layer made of an InGaN crystal. Moreover, normally, even if the GaN crystal film is annealed, about 1/10 to 1/5 of the doped Mg remains unactivated, which brings about a problem regarding difficulty in providing the annealing effect.

Patent Document 1: Japanese Examined Patent Application, Second Publication No. Hei 5-86646
Patent Document 2: Japanese Patent No. 3440873
Patent Document 3: Japanese Patent No. 3700492
Patent Document 4: Japanese Unexamined Patent Application, First Publication No. Sho 60-039819
Patent Document 5: Japanese Unexamined Patent Application, First Publication No. Hei 8-264478

DISCLOSURE OF INVENTION

Problems to be Solved by the Invention

The present invention takes the above problems into consideration with an object of providing a method for manufacturing a Group III nitride semiconductor which is capable of improving the crystallinity of a Group III nitride semiconductor laminated on a substrate by a sputtering method without performing a heat treatment such as annealing after the film formation, and is capable of laminating a p-type Group III nitride semiconductor having a sufficiently high carrier concentration through addition of Mg as a dopant. In addition, the present invention has other objects to provide a method for manufacturing a Group III nitride semiconductor light-emitting device using the method for manufacturing a Group III nitride semiconductor, a Group III nitride semiconductor light-emitting device having excellent light emission characteristics, and a lamp.

Means to Solve the Problems

As a result of intensive studies conducted by the inventors of the present invention, it has been revealed that, regarding the hydrogen contamination issue of a GaN crystal film as described above, hydrogen in the crystal film can be removed to the outside by applying reverse sputtering (plasma treatment) with an Ar gas plasma to a Mg-doped GaN crystal film that has been formed by a sputtering method. However, such a hydrogen removal effect by means of reverse sputtering can only be obtained within a range of about 100 Å (0.01 μm) from the film surface. In cases of a Mg-doped GaN crystal film having a maximum thickness of about 1.0 μm, hydrogen can be removed in the vicinity of the crystal film surface whereas hydrogen deep inside the crystal film away from the surface is difficult to eliminate. For this reason, even if reverse sputtering is applied to the formed Mg-doped GaN crystal film, the Mg dopant concentration is inevitably lowered in the GaN crystal film, which may cause concern of deactivation of the GaN crystal.

With regard to such a problem, the inventors of the present invention have found out that, upon formation of a Mg-doped GaN crystal film (p-type semiconductor layer), a p-type Group III nitride semiconductor having a sufficiently high carrier concentration can be formed while efficiently eliminating hydrogen without performing an annealing treatment or the like, by laminating the semiconductor thin film through alternate repetitions of a step for forming a semiconductor thin film made of GaN with a thickness within a predetermined range, and a step for applying an inert gas plasma treatment to this semiconductor thin film. These findings have led to the completion of the present invention.

That is, the present invention relates to the following.

[1] method for manufacturing a Group III nitride semiconductor, comprising a sputtering step for disposing a substrate and a target in a chamber and forming a Mg-doped Group III nitride semiconductor on the substrate by a reactive sputtering method, wherein the sputtering step includes respective substeps of: a film formation step for forming a semiconductor thin film while doping with Mg; and a plasma treatment step for applying an inert gas plasma treatment to the semiconductor thin film that has been formed in the film formation step, and the Group III nitride semiconductor is formed by laminating the semiconductor thin film through alternate repetitions of the film formation step and the plasma treatment step.

[2] The method for manufacturing a Group III nitride semiconductor according to [1], wherein the Mg-doped semiconductor thin film is formed with a thickness within a range of 1 to 100 nm in the film formation step, and the Group III nitride semiconductor is formed by laminating the semiconductor thin film through alternate repetitions of the film formation step within the above range of film thickness and the plasma treatment step in the sputtering step.

[3] The method for manufacturing a Group III nitride semiconductor according to either one of [1] and [2], wherein the film formation step is performed while circulating a hydrogen-containing gas and/or a nitrogen-containing gas in the chamber.

[4] The method for manufacturing a Group III nitride semiconductor according to [3], wherein the nitrogen-containing gas is an ammonia gas.

[5] The method for manufacturing a Group III nitride semiconductor according to any one of [1] through [4], wherein a temperature of the substrate is set within a range of 300° C. to 1200° C. in the film formation step.

[6] The method for manufacturing a Group III nitride semiconductor according to any one of [1] through [5], wherein a power for generating an inert gas plasma in the chamber is within a range of 10 to 5000 W in the plasma treatment step.

[7] The method for manufacturing a Group III nitride semiconductor according to any one of [1] through [6], wherein a duration for the inert gas plasma treatment is within a range of 1 to 600 seconds in the plasma treatment step.

[8] The method for manufacturing a Group III nitride semiconductor according to any one of [1] through [7], wherein any one type or more selected from He, Ne, Ar, Kr, and Xe is used as the inert gas to be circulated in the chamber in the plasma treatment step.

[9] The method for manufacturing a Group III nitride semiconductor according to any one of [1] through [8], wherein a temperature of the substrate is set within a range of room temperature to 800° C. in the plasma treatment step.

[10] The method for manufacturing a Group III nitride semiconductor according to any one of [1] through [9], wherein the plasma treatment step is performed under a pressure within a range of $1 \times 10^{-5}$ to 10 Pa in the chamber.

[11] The method for manufacturing a Group III nitride semiconductor according to any one of [1] through [10], wherein the semiconductor thin film is laminated within a range of 1 to 1000 times of alternate repetitions of the film formation step and the plasma treatment step, in the sputtering step.

[12] The method for manufacturing a Group III nitride semiconductor according to any one of [1] through [11], wherein an interval within a range of 1 to 300 seconds is provided between the film formation step and the plasma treatment step to be alternately repeated in the sputtering step.

[13] The method for manufacturing a Group III nitride semiconductor according to any one of [1] through [12], wherein an adjustment step for changing at least any one treatment condition of the film formation step or the plasma treatment step is provided between the film formation step and the plasma treatment step to be alternately repeated in the sputtering step.

[14] The method for manufacturing a Group III nitride semiconductor according to [13], wherein the adjustment step is for changing at least any one treatment condition amongst a treatment duration or a substrate temperature in the film formation step, or a power, a treatment duration, a substrate temperature, or a pressure in the chamber in the plasma treatment step.

[15] The method for manufacturing a Group III nitride semiconductor according to any one of [1] through [14], wherein a step for forming a ground layer comprised of a Group III nitride semiconductor on the substrate is provided at least prior to the sputtering step.

[16] A method for manufacturing a Group III nitride semiconductor light-emitting device which comprises a semiconductor layer having an n-type semiconductor layer, a light-emitting layer, and a p-type semiconductor layer respectively comprised of Group III nitride semiconductors and sequentially laminated, in which at least a part of the p-type semiconductor layer is doped with Mg, the method comprising: forming at least a part of the p-type semiconductor layer by the method for manufacturing a Group III nitride semiconductor according to any one of [1] through [15].

[17] A Group III nitride semiconductor light-emitting device comprising: a semiconductor layer having an n-type semiconductor layer, a light-emitting layer, and a p-type semiconductor layer respectively comprised of Group III nitride semiconductors and sequentially laminated, in which at least a part of the p-type semiconductor layer is doped with Mg, wherein at least a part of the p-type semiconductor layer is formed by the method for manufacturing a Group III nitride semiconductor according to any one of [1] through [15].

[18] The Group III nitride semiconductor light-emitting device according to [17], wherein a thickness of the p-type semiconductor layer is set within a range of 0.05 to 1 mm.

[19] The Group III nitride semiconductor light-emitting device according to either one of [17] and [18], wherein a Mg dopant concentration in the p-type semiconductor layer is set within a range of $1 \times 10^{19}$ to $5 \times 10^{20}/cm^3$.

[20] The Group III nitride semiconductor light-emitting device according to any one of [17] through [19], wherein a hydrogen concentration in the p-type semiconductor layer is set at $1 \times 10^{16}/cm^3$ or lower.

[21] A lamp comprising the Group III nitride semiconductor light-emitting device according to any one of [17] through [20].

Effect of the Invention

According to the method for manufacturing a Group III nitride semiconductor of the present invention, upon formation of a Mg-doped Group III nitride semiconductor by a sputtering method, semiconductor thin films are laminated through alternate repetitions of the film formation step for forming a semiconductor thin film while doping with Mg, and the plasma treatment step for applying an inert gas plasma treatment to the semiconductor thin film that has been formed in the film formation step. Therefore, hydrogen can be efficiently eliminated from the Mg-doped semiconductor layer, so as to grow the Group III nitride semiconductor in which the Mg dopant is activated. In addition, since Mg in the semiconductor layer is activated, the amount of the Mg dopant can be reduced, in which case, a Group III nitride semiconductor having more excellent crystallinity can be obtained. Therefore, a Group III nitride semiconductor light-emitting device having excellent light emission characteristics can be produced using a sputtering method which excels in the mass productivity and the reproducibility, without the need for facilities such as for an annealing step for eliminating hydrogen.

Moreover, if a Mg-doped semiconductor thin film having high crystallinity is formed while circulating a hydrogen-containing gas and a nitrogen-containing gas in a chamber in the film formation step, and if an inert gas plasma treatment is applied to the Mg-doped semiconductor thin film in the subsequent plasma treatment step, then it becomes possible to obtain both excellent crystallinity by performing the film formation step in the hydrogen-containing gas atmosphere, and a Mg activation effect by the hydrogen removal effect of the plasma treatment step.

Furthermore, according to the method for manufacturing a Group III nitride semiconductor light-emitting device of the present invention, the method is to form at least a part of the p-type semiconductor layer from a Mg-doped Group III nitride semiconductor by the above manufacturing method. Therefore, a Group III nitride semiconductor light-emitting device which comprises a p-type semiconductor layer comprised of a Group III nitride semiconductor having excellent crystallinity, and has excellent light emission characteristics, can be obtained.

BRIEF DESCRIPTION OF THE REFERENCE SYMBOLS

1: Group III nitride semiconductor light-emitting device, 10: Laminated semiconductor (Group III nitride semiconductor), 11: Substrate, 11a: Surface, 12: Buffer layer, 14: N-type semiconductor layer, 15: Light-emitting layer, 16: P-type semiconductor layer (Group III nitride semiconductor), 16a: P-type clad layer, 16b: P-type contact layer, 3: Lamp, 40: Sputtering apparatus, 41: Chamber, 47: Target, A and B: Semiconductor thin films

BEST MODE FOR CARRYING OUT THE INVENTION

Hereunder is a description of one embodiment of a method for manufacturing a Group III nitride semiconductor, a method for manufacturing a Group III nitride semiconductor light-emitting device, a Group III nitride semiconductor light-emitting device, and a lamp according to the present invention, with appropriate reference to FIGS. 1 to 6.

[Method for Manufacturing a Group III Nitride Semiconductor]

The method for manufacturing a Group III nitride semiconductor of the present embodiment comprises a sputtering step for disposing a substrate 11 (refer to FIGS. 1 to 3) and a target 47 (refer to FIG. 5) in a chamber 41 (refer to FIG. 5), and forming a Mg-doped Group III nitride semiconductor (p-type semiconductor layer 16 shown in FIG. 1) on the substrate 11 by a reactive sputtering method, wherein the sputtering step includes respective substeps of: a film formation step for forming a semiconductor thin film (refer to reference symbol A shown in FIG. 6) while doping with Mg; and a plasma treatment step for applying an inert gas plasma treatment to the semiconductor thin film that has been formed in the film formation step, and the Group III nitride semiconductor is formed by laminating the semiconductor thin films through alternate repetitions of the film formation step and the plasma treatment step.

<Laminated Structure of Semiconductor>

Figure 1:
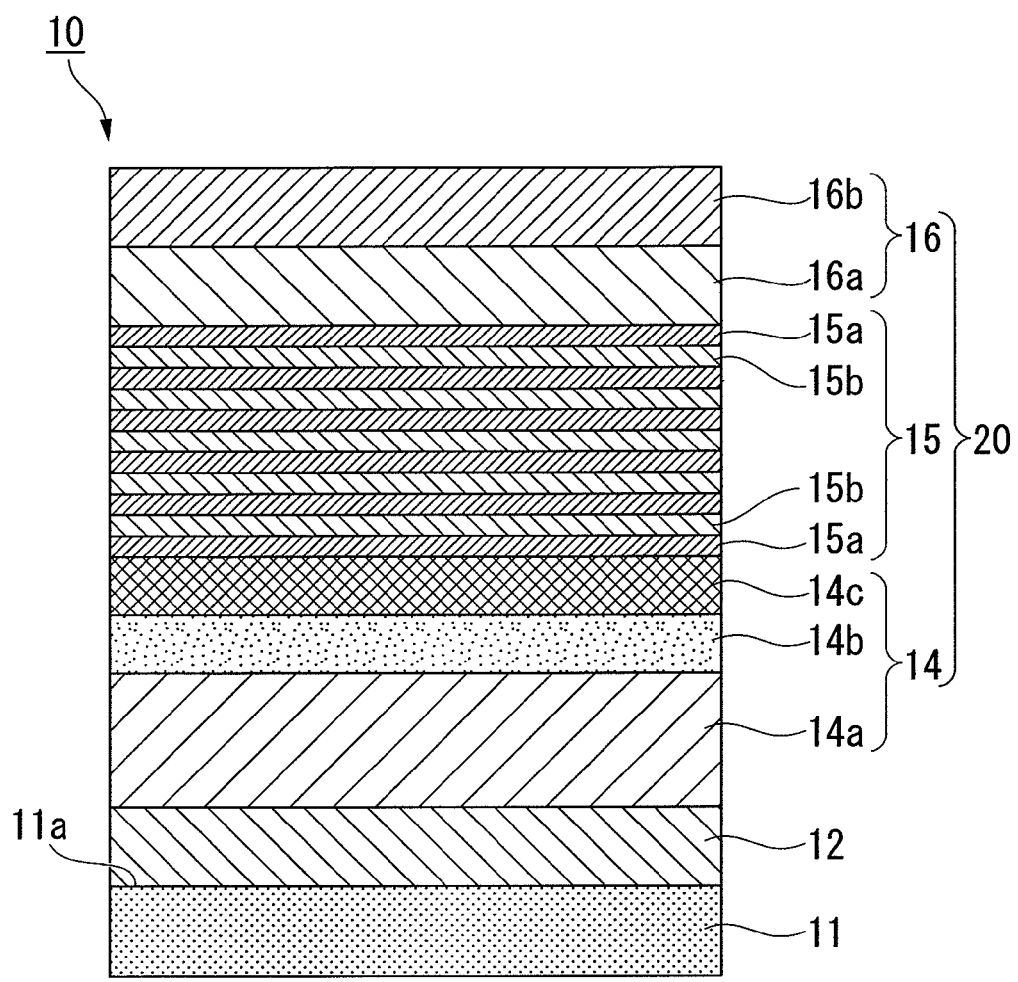
FIG. 1 is a schematic diagram for explaining an example of a Group III nitride semiconductor according to the present invention, showing a cross-sectional structure of a laminated semiconductor.

FIG. 1 is a schematic diagram for explaining an example of the method for manufacturing a Group III nitride semiconductor according to the present invention, being a schematic cross-sectional diagram showing an example of a laminated semiconductor in which the Group III nitride semiconductor is formed on a substrate. In the laminated semiconductor 10 as shown in FIG. 1, on the substrate 11 is laminated a buffer layer 12 made of a Group III nitride compound; and on the buffer layer 12 is formed a semiconductor layer 20 having an n-type semiconductor layer 14, a light-emitting layer 15, and a p-type semiconductor layer 16 sequentially laminated.

The p-type semiconductor layer 16 of the present embodiment is made of a Mg-doped Group III nitride semiconductor, and is formed by the method for manufacturing a Group III nitride semiconductor of the present invention, details of which will be described later.

Hereunder is a detailed description of the laminated structure of the Group III nitride semiconductor of the present embodiment.

[Substrate]

As a material which can be used for the substrate 11 in present embodiment, any substrate material on the surface of which a Group III nitride compound semiconductor crystal can epitaxially grow, can be used by selecting from various materials without particular limitations. Examples thereof include sapphire, SiC, silicon, zinc oxide, magnesium oxide, manganese oxide, zirconium oxide, manganese oxide zinc iron, magnesium oxide aluminum, zirconium borate, gallium oxide, indium oxide, lithium oxide gallium, lithium oxide aluminum, neodymium oxide gallium, lantern oxide strontium aluminum tantalum, strontium oxide titanium, titanium oxide, hafnium, tungsten, and molybdenum. Among them, a material having a hexagonal crystal structure such as sapphire and SiC is preferably used for the substrate, since a Group III nitride semiconductor having excellent crystallinity can be laminated thereon.

In addition, regarding the size of the substrate, those having a diameter of about two inches are usually used, while those having a diameter of four to six inches can also be used for the Group III nitride semiconductor of the present invention.

Among the abovementioned substrate materials, some oxide substrates and metal substrates are known to cause chemical decomposition by being contacted with ammonia at a high temperature. If such an oxide substrate or a metal substrate is used, it is effective to form a buffer layer without using ammonia and to form a ground layer which constitutes an n-type semiconductor layer, which will be described later, with ammonia, in terms of prevention of such chemical decomposition of the substrate because the buffer layer of the present embodiment acts as a coat layer. In addition, in general, the temperature of the substrate can be kept low in a sputtering method. Hence, even if a substrate made of a material decomposable at high temperatures is used, each layer can be formed on the substrate without damaging the substrate 11.

[Buffer Layer]

In the laminated semiconductor 10 of the present embodiment, the buffer layer 12 made of a Group III nitride compound is formed on the substrate 11 through a reaction between a metal material and a group V element-containing gas under plasma activation. A film formed by a method using plasma of a metal material as shown in the present embodiment has an effect of readily attaining orientation.

The crystal of the Group III nitride compound forming such a buffer layer has a crystal structure of hexagonal system, and can be formed into a single crystal film by controlling film formation conditions. Moreover, the crystal of the Group III nitride compound can also be in a form of a columnar crystal made of an aggregate structure that is basically a hexagonal column, by controlling the above film formation conditions. The columnar crystal described herein refers to a crystal in which adjacent crystal grains are separated since grain boundaries are formed therebetween, and the crystal itself is in a columnar shape in a longitudinal section.

The buffer layer 12 preferably takes a single crystal structure, in terms of the buffer function. As described above, the crystal of the Group III nitride compound has a crystal structure of a hexagonal system, and forms a structure that is basically a hexagonal column. The crystal of the Group III nitride compound is capable of forming a crystal film grown in the in-plane direction, by controlling film formation conditions or the like. When the buffer layer 12 having such a single crystal structure is formed on the substrate 11, the buffer function of the buffer layer 12 effectively works. Therefore, the layer of the Group III nitride semiconductor to be formed thereon will become a crystal film having excellent orientation and crystallinity.

The thickness of the buffer layer 12 is preferably within a range of 20 to 80 nm. By setting the thickness of the buffer layer 12 within this range, the buffer layer 12 can attain excellent orientation and effectively function as a coat layer upon formation of respective layers made of Group III nitride semiconductors on the buffer layer 12.

If the thickness of the buffer layer 12 is less than 20 nm, the abovementioned function as a coat layer may become insufficient. In addition, if the buffer layer 12 is formed with a thickness of more than 80 nm, it may take a longer time to form the layer although the function as a coat layer remains unchanged, which may lower the productivity.

The buffer layer 12 preferably has an Al-containing composition, and any Group III nitride compound semiconductor material represented by the general formula AlGaInN may be used. Furthermore, As or P may also be contained as a group V element.

Moreover when the buffer layer 12 has an Al-containing composition, then in particular, the composition is preferably GaAlN. In such a case, the composition preferably contains Al at 50% or more. In addition, more preferably, the buffer layer 12 is made of AlN.

Furthermore, as the material for forming the buffer layer 12, any material having the same crystal structure as that of the Group III nitride semiconductor may be used, although materials having a lattice length close to that of a Group III nitride semiconductor for forming the ground layer, which will be described later, are preferred, and in particular nitrides of Group IIIa elements in the periodic table are suitable.

[Semiconductor Layer]

As shown in FIG. 1, in the laminated semiconductor 10 of the present embodiment, a semiconductor layer 20, which is composed of a Group III nitride-based semiconductor and comprises the n-type semiconductor layer 14, the light-emitting layer 15, and the p-type semiconductor layer 16, is laminated on the substrate 11 through a buffer layer 12. In addition, in the laminated semiconductor 10 exemplified in the drawing, a ground layer 14a provided in the n-type semiconductor layer 14 is laminated on the buffer layer 12.

As the Group III nitride semiconductor, a variety of gallium nitride-based compound semiconductors such as those represented by the general formula $Al_XGa_YIn_ZN_{1-A}M_A$ ($0 \leq X \leq 1$, $0 \leq Y \leq 1$, $0 \leq Z \leq 1$, and $X+Y+Z=1$. The symbol M represents a Group V element other than nitrogen (N), and $0 \leq A < 1$) are known. In the present invention, any gallium nitride-based compound semiconductor represented by the general formula $Al_XGa_YIn_ZN_{1-A}M_A$ ($0 \leq X \leq 1$, $0 \leq Y \leq 1$, $0 \leq Z \leq 1$, and $X+Y+Z=1$. The symbol M represents a Group V element other than nitrogen (N), and $0 \leq A < 1$), including these known gallium nitride-based compound semiconductors, may be employed without any limitations.

The gallium nitride-based compound semiconductor may contain any other Group III element other than Al, Ga, and In, and may also contain, if necessary, an element such as Ge, Si, Mg, Ca, Zn, Be, P, and As. Furthermore, in some cases, such a gallium nitride-based compound semiconductor contains not only intentionally added elements, but also impurities inevitably contained depending on the film formation conditions, and the like, and trace amounts of impurities contained in raw materials and reaction tube materials.

[N-Type Semiconductor Layer]

The n-type semiconductor layer 14 is usually laminated on the buffer layer 12, and made of the ground layer 14a, an n-type contact layer 14b, and an n-type clad layer 14c. It should be noted that the n-type contact layer may function as a ground layer and/or an n-type clad layer, whereas the ground layer may also function as an n-type contact layer and/or an n-type clad layer.

[Ground Layer]

The ground layer 14a of the present embodiment is made of a Group III nitride semiconductor, and is formed by laminating on the buffer layer 12 by a conventionally known MOCVD method.

It is not always necessary for the material of the ground layer 14a to be the same as that of the buffer layer 12 formed on the substrate 11, and different materials may be used; however, the ground layer 14a is preferably composed of an $Al_yGa_{1-y}N$ layer ($0 \leq y \leq 1$, preferably $0 \leq y \leq 0.5$, and more preferably $0 \leq y \leq 0.1$).

In the case of forming the respective layers composed of Group III nitride semiconductors on the substrate, for example, it is difficult to form a single crystal of a Group III nitride semiconductor directly on the (0001) c plane of the substrate made of sapphire by a sputtering method, due to the difference in the lattice constant between the substrate and the Group III nitride semiconductor. Therefore, in the present invention, a ground layer 14a composed of a single crystal Group III nitride semiconductor is previously formed on the substrate 11 on which the buffer layer 12 has been formed. A single crystal layer of a Group III nitride semiconductor having excellent crystallinity can be readily formed on the single crystal ground layer 14a by a sputtering method. Therefore, a Group III nitride semiconductor whose conductivity has been controlled to p-type by doping with Mg (p-type semiconductor 16 that will be described below) can be readily obtained.

As the material used for the ground layer 14a, a Ga-containing Group III nitride compound, i.e. a GaN-based compound semiconductor, is used. In particular, AlGaN or GaN can be suitably used.

In addition, if the buffer layer 12 is formed into a columnar crystal aggregate made of AlN, it is necessary to loop dislocations by means of migration so that the ground layer 14a will not directly take over the crystallinity of the buffer layer 12. As such a material, the abovementioned GaN-based compound semiconductors including Ga can be enumerated. In particular, AlGaN or GaN is suitable.

The thickness of the ground layer 14a is preferably set within a range of 0.1 to 8 μm in terms of providing a ground layer having excellent crystallinity, and more preferably a range of 0.1 to 2 μm in terms of reduction of the processing time required for the film formation and improvement of the productivity.

As required, the ground layer 14a may be doped with an n-type impurity within a range of $1 \times 10^{17}$ to $1 \times 10^{19}/cm^3$, or undoped ($<1 \times 10^{17}/cm^3$), although it is preferably undoped in terms of maintenance of excellent crystallinity.

If the substrate 11 is electrically conductive, electrodes can be formed on and below the light-emitting device by doping a dopant into the ground layer 14a to make it electrically conductive. On the other hand, if an insulating material is used for the substrate 11, a chip structure is taken in which a positive electrode and a negative electrode are both disposed on the same surface of the light-emitting device. Hence, the ground layer 14a is preferably an undoped crystal for better crystallinity. The type of the n-type impurity is not particularly limited. Examples thereof include Si, Ge, and Sn, and preferably Si and Ge.

[N-Type Contact Layer]

The n-type contact layer 14b of the present embodiment is made of a Group III nitride semiconductor, and is formed by laminating on the ground layer 14a by a sputtering method.

The n-type contact layer 14b is preferably composed of an $Al_XGa_{1-X}N$ layer ($0 \leq x \leq 1$, preferably $0 \leq x \leq 0.5$, and more preferably $0 \leq x \leq 0.1$), similarly to the ground layer 14a. In addition, an n-type impurity is preferably doped therein. The n-type impurity is preferably contained at a concentration of $1 \times 10^{17}$ to $1 \times 10^{19}/cm^3$, and preferably $1 \times 10^{18}$ to $1 \times 10^{19}/cm^3$, in terms of maintenance of excellent ohmic contact with the negative electrode, prevention against cracking, and maintenance of excellent crystallinity. The type of the n-type impurity is not particularly limited. Examples thereof include Si, Ge, and Sn, and preferably Si and Ge. The growth temperature is similar to that of the ground layer. In addition, as described above, the n-type contact layer 14b may also function as a ground layer.

The gallium nitride-based compound semiconductors respectively constituting the ground layer 14a and the n-type contact layer 14b preferably have the same composition. Preferably, the total film thickness of these layers is set within a range of 0.1 to 20 μm, preferably 0.5 to 15 μm, and more preferably 1 to 12 μm. If the total film thickness is within such a range, the crystallinity of the semiconductor can be kept excellent.

[N-Type clad Layer]

The n-type clad layer 14c is preferably provided between the abovementioned n-type contact layer 14b and the light-emitting layer 15 described in detail below. By providing the n-type clad layer 14c, non-flatness occurring in the outermost surface of the n-type contact layer 14b can be improved. The n-type clad layer 14c can be formed of AlGaN, GaN, GaInN, or the like, through a sputtering method or the like. In addition, the n-type clad layer 14c may also take a superlattice structure having a heterojunction, or multiple laminations, of these structures. In the case of GaInN, it is needless to say that the band gap of the n-type clad layer 14c is desirably greater than that of the GaInN of the light-emitting layer 15.

The thickness of the n-type clad layer 14c is not particularly limited, although it is preferably within a range of 5 to 500 nm, and more preferably 5 to 100 nm. Moreover, the concentration of an n-type dopant in the n-type clad layer 14c is preferably within a range of $1\times10^{17}$ to $1\times10^{20}/cm^3$, and more preferably $1\times10^{18}$ to $1\times10^{19}/cm^3$. The dopant concentration is preferably within this range in terms of maintenance of excellent crystallinity and reduction of the operating voltage of the light-emitting device.

[P-Type Semiconductor Layer]

The p-type semiconductor layer 16 is normally composed of a p-type clad layer 16a and a p-type contact layer 16b, and is formed through a reactive sputtering method. In addition, the p-type contact layer may also function as the p-type clad layer.

The p-type semiconductor layer 16 of the present embodiment is doped with a p-type impurity for controlling the conductivity to p-type. The type of the p-type impurity is not particularly limited, although Mg is preferably used. Moreover, similarly, Zn may also be used.

In addition, the total thickness of the p-type semiconductor layer 16 is not particularly limited, although it is preferably within a range of 0.05 to 1 µm.

[P-Type clad Layer]

The p-type clad layer 16a is not particularly limited as long as the composition allows a greater band gap energy than that of the light-emitting layer 15, details of which will be described later, and carrier confinement in the light-emitting layer 15 can be achieved, although $Al_dGa_{1-d}N$ ($0<d\leq0.4$, and preferably $0.1\leq d\leq0.3$) is preferred. The p-type clad layer 16a is preferably composed of such AlGaN in terms of carrier confinement in the light-emitting layer 15.

The thickness of the p-clad layer 16a is not particularly limited, although it is preferably 1 to 400 nm and more preferably 5 to 100 nm.

The p-type dopant concentration, resulting from the addition of the p-type impurity into the p-type clad layer 16a, is preferably set within a range of $1\times10^{18}$ to $5\times10^{21}/cm^3$, and more preferably $1\times10^{19}$ to $5\times10^{20}/cm^3$. If the p-type dopant concentration is within the above range, an excellent p-type crystal can be obtained without lowering the crystallinity.

[P-Type Contact Layer]

The p-type contact layer 16b is a gallium nitride-based compound semiconductor layer containing at least $Al_eGa_{1-e}N$ ($0\leq e<0.5$, preferably $0\leq e\leq0.2$, and more preferably $0\leq e\leq0.1$). The Al composition is preferably within the above range in terms of maintenance of excellent crystallinity and excellent ohmic contact with the p-ohmic electrode (refer to a transparent electrode 17 that will be described later).

The thickness of the p-type contact layer 16b is not particularly limited, although it is preferably 10 to 500 nm and more preferably 50 to 200 nm. The film thickness is preferably within this range in terms of light emission output.

In addition, the p-type dopant concentration, resulting from the addition of the p-type impurity into the p-type contact layer 16b, is preferably set within a range of $1\times10^{18}$ to $1\times10^{21}/cm^3$, and more preferably $5\times10^{19}$ to $5\times10^{20}/cm^3$, in terms of maintenance of excellent ohmic contact, prevention against cracking, and maintenance of excellent crystallinity.

[Light-Emitting Layer]

The light emitting layer 15 is a layer which is laminated on the n-type semiconductor layer 14, as well as being a layer on which the p-type semiconductor layer 16 is laminated. The light emitting layer 15 can be formed by a conventionally known MOCVD method. In addition, as shown in FIG. 1, the light emitting layer 15 has a structure in which each of the barrier layers 15a made of a gallium nitride-based compound semiconductor, and well layers 15b made of an indium-containing gallium nitride-based compound semiconductor is laminated alternately and repeatedly. In the illustrated example, the barrier layers 15a are arranged at both sides of the n-type semiconductor layer 14 and the p-type semiconductor layer 16.

As the barrier layer 15a, for example, a gallium nitride-based compound semiconductor such as $Al_cGa_{1-c}N$ ($0\leq c<0.3$) whose band gap energy is greater than that of the well layer 15b made of an indium-containing gallium nitride-based compound semiconductor is preferably used.

In addition, for the well layer 15b, for example, a gallium nitride indium such as $Ga_{1-s}In_sN$ ($0<s<0.4$) can be used as the indium-containing gallium nitride-based compound semiconductor.

The total thickness of the light-emitting layer 15 is not particularly limited. For example, the thickness of the light-emitting layer 15 is preferably within a range of 1 to 500 nm, and more preferably around 100 nm. The film thickness within the above range contributes to improvement of the light emission output.

<Manufacturing Method>

As described above, the method for manufacturing a Group III nitride semiconductor of the present embodiment comprises a sputtering step for disposing the substrate 11 and the target 47 in the chamber 41, and forming a Mg-doped Group III nitride semiconductor (p-type semiconductor layer 16) on the substrate 11 by a reactive sputtering method, wherein the sputtering step includes respective substeps of: a film formation step for forming a semiconductor thin film (refer to reference symbol A shown in FIG. 6) while doping with Mg; and a plasma treatment step for applying an inert gas plasma treatment to the semiconductor thin film that has been formed in the film formation step, and the p-type semiconductor layer 16 composed of the Group III nitride semiconductor is formed by laminating the semiconductor thin film through alternate repetitions of the film formation step and the plasma treatment step.

In the manufacturing method of the present embodiment, upon formation of the laminated semiconductor 10 as shown in FIG. 1 by epitaxially growing a Group III nitride semiconductor crystal on the substrate 11, the buffer layer 12 is formed on the substrate 11, and the semiconductor layer 20 is formed thereon. In the present embodiment, the method is such that: the buffer layer 12 is formed by a sputtering method; the ground layer 14a of the n-type semiconductor layer 14 is formed thereon by a MOCVD method; then the n-type contact layer 14b is formed by a sputtering method; the n-type clad layer 14c and respective layers of the light-emitting layer 15 are formed thereon by a MOCVD method; and then the p-type semiconductor layer 16 is formed by a sputtering method.

[Formation of Buffer Layer]

The substrate 11 is desirably subjected to a pretreatment using a sputtering method or the like, after the substrate 11 had been introduced in a reactor and before the buffer layer 12 is formed. Specifically, the surface can be conditioned by exposing the substrate 11 to a plasma of Ar or $N_2$. For example, by treating the surface of the substrate 11 with a plasma of an Ar gas, an $N_2$ gas, or the like, organic materials and oxides adhered onto the surface of the substrate 11 can be removed. In this case, if an electrical voltage is applied between the substrate 11 and the chamber, plasma will act efficiently on the substrate 11. By applying such a pretreatment to the substrate 11, the buffer layer 12 can be formed all over the surface 11a of the substrate 11, which enables improvement of the crystallinity of a film to be formed thereon.

In addition, when the buffer layer 12 is formed on the substrate 11, the substrate 11 may also be subjected to a wet-type pretreatment. For example, the film-forming process can be stabilized by performing hydrogen-termination using a well known RCA washing method on the surface of the substrate 11 made of silicon.

After the pretreatment on the surface of the substrate 11, an argon gas and a nitrogen gas are introduced into the sputtering apparatus, and the temperature of the substrate 11 is set at about 500° C. Then, the buffer layer 12 made of AlN is formed on the substrate 11 while applying a high frequency bias to the substrate 11 side, applying power to the side of the Al target made of a metal Al, and keeping the pressure in the furnace constant.

As the method for forming the buffer layer 12 on the substrate 11, for example, a MOCVD method, a pulsed laser deposition (PLD) method, a pulsed electron deposition (PED) method, and the like can be enumerated in addition to the sputtering method. These methods may be appropriately selected for use, although the sputtering method is a preferred method since it is most convenient and suitable for mass production. If a DC sputtering method is employed, the target surface may be so charged that the film formation rate becomes unstable. Therefore, a pulsed DC sputtering method or an RF sputtering method is desirably employed.

[Formation of Semiconductor Layer]

The semiconductor layer 20 is formed by sequentially laminating the n-type semiconductor layer 14, the light-emitting layer 15, and the p-type semiconductor layer 16 in this order on the buffer layer 12. As described above, in the manufacturing method of the present embodiment: the ground layer 14a of the n-type semiconductor layer 14 is formed by a MOCVD method; then the n-type contact layer 14b is formed by a sputtering method; the n-type clad layer 14c and respective layers of the light-emitting layer 15 are formed thereon by a MOCVD method; and then the p-type semiconductor layer 16 is formed by a sputtering method.

There is no particular limitation in the method for growing the gallium nitride-based compound semiconductor for forming the semiconductor layer 20, and any method known to grow a nitride semiconductor may be applied. Besides the abovementioned sputtering method, there can be enumerated MOCVD (Metal Organic Chemical Vapor Deposition), HYPE (Hydride Vapor Phase Epitaxy), and MBE (Molecular Beam Epitaxy). Among these methods, in the MOCVD method, hydrogen ($H_2$) or nitrogen ($N_2$) is employed as a carrier gas, trimethylgallium (TMG) or triethylgallium (TEG) is employed as a Ga (Group III element) source, trimethylaluminum (TMA) or triethylaluminum (TEA) is employed as an Al (Group III element) source, trimethylindium (TMI) or triethylindium (TEI) is employed as an In (Group III element) source, and ammonia ($NH_3$), hydrazine ($N_2H_4$), or the like is employed as an N (Group V element) source. In addition, as the n-type impurity serving as the dopant element, monosilane ($SiH_4$) or disilane ($Si_2H_6$) may be employed as a Si source, and an organic germanium compound such as germane gas ($GeH_4$), tetramethylgermanium ($(CH_3)_4Ge$), or tetraethylgermanium ($(C_2H_5)_4Ge$) may be employed as a Ge source. In the MBE method, a germanium element may also be employed as a source of dopant. For example, as the p-type impurity serving as the dopant element, bis(cyclopentadienyl)magnesium ($Cp_2Mg$) or bis(ethylcyclopentadienyl)magnesium (($EtCp)_2Mg$) is employed as an Mg source.

The abovementioned gallium nitride-based compound semiconductor may contain any other Group III element other than Al, Ga, and In, and may also contain, if necessary, a dopant element such as Ge, Si, Mg, Ca, Zn, Be, P, and As. Furthermore, in some cases, such a gallium nitride-based compound semiconductor contains not only intentionally added elements, but also impurities inevitably contained depending on the film formation conditions, and the like, and trace amounts of impurities contained in raw materials and reaction tube materials.

[Formation of N-Type Semiconductor Layer]

When forming the semiconductor layer 20 of the present embodiment, at first, the ground layer 14a of the n-type semiconductor layer 14 is formed by laminating on the buffer layer 12 by a conventionally known MOCVD method. Next, the n-type contact layer 14b is formed on the ground layer 14a by a sputtering method, and then the n-type clad layer 14c is formed thereon by a MOCVD method. On this occasion, the respective layers of the ground layer 14a and the n-type clad layer 14c can be formed in the same MOCVD furnace.

As the method for forming the ground layer 14a composed of a single crystal Group III nitride semiconductor, for example, there is a method in which a low temperature buffer layer made of the abovementioned $Al_yGa_{1-y}N$ ($0 \leq y \leq 1$) is formed on the substrate 11 by a MOCVD method, and then a single crystal GaN layer is formed thereon by a MOCVD method at a temperature higher than the temperature for forming the low temperature buffer layer. In addition, instead of the low temperature buffer layer by the MOCVD method, a polycrystal buffer layer made of $Al_yGa_{1-y}N$ ($0 \leq y \leq 1$) may be formed by a sputtering method, and such a single crystal GaN layer may be formed thereon by the MOCVD method.

Moreover, the single crystal GaN layer may also be grown by a sputtering method.

[Formation of Light-Emitting Layer]

The light-emitting layer 15 is formed on the n-type clad layer 14c by a conventionally known MOCVD method.

The light-emitting layer 15 exemplified in FIG. 1 to be formed in the present embodiment has a laminated structure starting from a GaN barrier layer and ending with a GaN barrier layer, which is formed by alternate laminations of six barrier layers 15a made of GaN and five well layers 15 made of undoped $In_{0.2}Ga_{0.8}N$.

In addition, in the manufacturing method of the present embodiment, the light-emitting layer 15 can be formed by a conventionally known MOCVD method, by using the MOCVD furnace which is the same as the furnace used for forming the n-type clad layer 14c.

[Formation of P-Type Semiconductor Layer]

The p-type semiconductor layer 16 composed of the p-type clad layer 16a and the p-type contact layer 16b is formed on the light-emitting layer 15, that is, a barrier layer 15a serving as the outermost layer of the light-emitting layer 15, with use of a sputtering method.

In the present embodiment, firstly, the p-type clad layer 16a made of Mg-doped $Al_{0.1}Ga_{0.9}N$ is formed on the light-emitting layer 15 (barrier layer 15a serving as the outermost layer), and then the p-type contact layer 16b made of Mg-doped $Al_{0.02}Ga_{0.98}N$ is formed thereon. On this occasion, the same sputtering apparatus may be used for laminating the p-type clad layer 16a and the p-type contact layer 16b.

[Sputtering Step]

Figure 5:
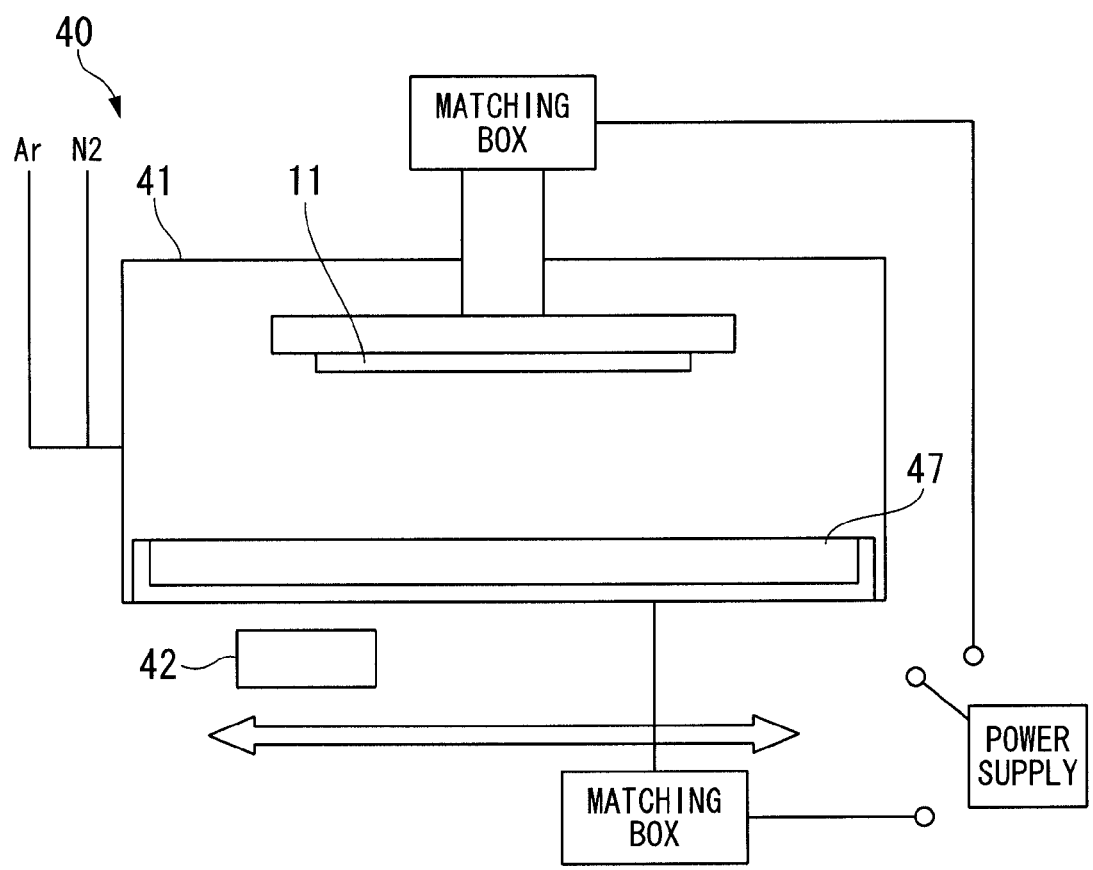
FIG. 5 is a schematic diagram for explaining an example of a method for manufacturing a Group III nitride semiconductor light-emitting device according to the present invention, showing a structure of a sputtering apparatus in which a target is provided in a chamber.
Figure 6:
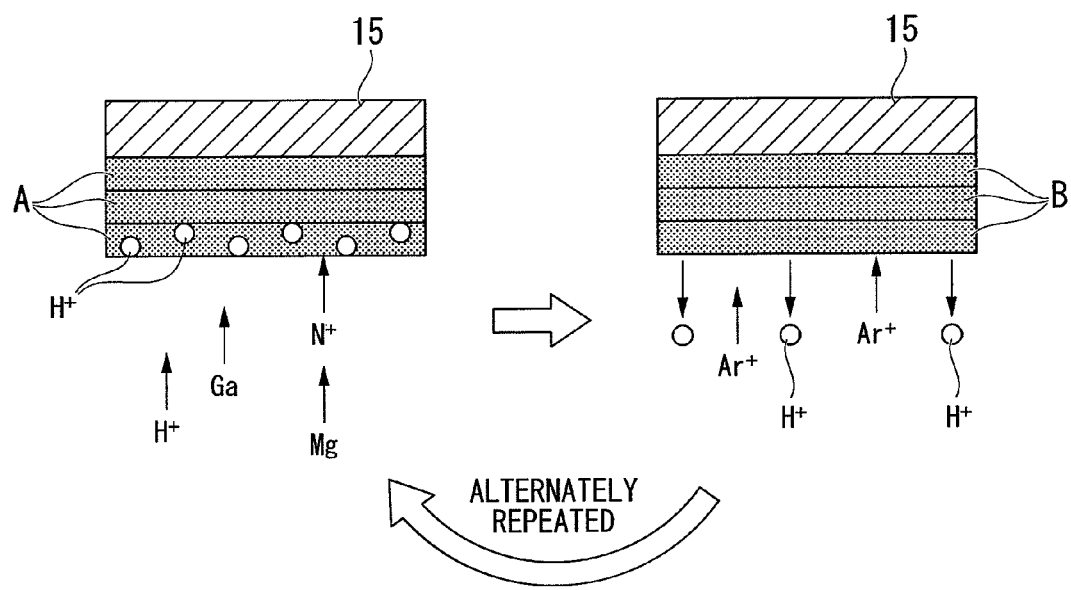
FIG. 6 is a schematic diagram for explaining an example of the method for manufacturing a Group III nitride semiconductor according to the present invention, showing a film formation step (a) where a Mg-doped Group III nitride semiconductor is formed on a substrate, and a plasma treatment step (b) where the Mg-doped Group III nitride semiconductor is subjected to an inert gas plasma treatment.

Hereunder is a detailed description of the sputtering step provided in the manufacturing method of the present embodiment, with appropriate reference to the schematic diagrams of the sputtering apparatus 40 exemplified in FIG. 5 and the plasma treatment shown in FIG. 6.

The sputtering step of the present embodiment is a step for forming at least a part of the p-type semiconductor layer 16, within the semiconductor layer 20 composed of Group III nitride semiconductors as shown in FIG. 1 (also refer to FIG. 3), from a Mg-doped Group III nitride semiconductor under the above respective conditions with use of a reactive sputtering method, wherein the sputtering step includes respective substeps of: a film formation step for forming a semiconductor thin film while doping with Mg; and a plasma treatment step for applying an inert gas plasma treatment to the semiconductor thin film that has been formed in the film formation step, and the p-type semiconductor layer 16 composed of the Group III nitride semiconductor is formed by laminating the semiconductor thin film through alternate repetitions of the film formation step and the plasma treatment step.

(Film Formation Step)

The film formation step provided as a substep in the sputtering step of the present embodiment is a step for forming a Mg-doped Group III nitride semiconductor film on the light-emitting layer 15 by a sputtering method. In the present embodiment, the p-type semiconductor layer 16 composed of the p-type clad layer 16a and the p-type contact layer 16b is formed on the light-emitting layer 15, that is, a barrier layer 15a serving as the outermost layer of the light-emitting layer 15, with use of a conventionally known sputtering method.

In the present embodiment, firstly, the p-type clad layer 16a made of Mg-doped $Al_{0.1}Ga_{0.9}N$ is formed on the light-emitting layer 15 (barrier layer 15a serving as the outermost layer), and then the p-type contact layer 16b made of Mg-doped $Al_{0.02}Ga_{0.98}N$ is formed thereon.

In such a step for forming a semiconductor layer made of a Group III nitride semiconductor with use of a sputtering method, other important parameters include the partial pressure of the nitrogen atom-containing gas, the film formation rate, the substrate temperature, the bias, and the power.

As the raw material of nitrogen used for the present invention, any generally known nitrogen compound may be used without any problem, although ammonia and nitrogen are particularly preferred because of their easy handling properties and availability at relatively low prices. Ammonia is efficiently decomposed and capable of forming a film at a high growth rate; however, ingenuity is required since ammonia is highly reactive and toxic, and thus requires a deharmnizer and a gas detector, and, in addition, materials of members for use in the reaction apparatus should be made of chemically stable substances, or the like.

On the other hand, when nitrogen is used as a raw material, the reaction rate is low although the apparatus can be made simple. However, in a method in which nitrogen is decomposed by an electric field, heat, or the like before introducing into the apparatus, nitrogen is capable of providing a usable degree of film formation rate although it is inferior to ammonia. Therefore, nitrogen is the most suitable nitrogen source considering the balance with the apparatus cost.

Moreover, when a hydrogen-containing gas is circulated in the gas atmosphere in the chamber 41, migration of reactive species is apt to occur on the surface of the Group III nitride semiconductor during the process of semiconductor lamination, which enables formation of a film made of AlGaN having excellent crystallinity.

The proportion of the hydrogen gas in the gas atmosphere in the chamber 41 is preferably set within a range of 0.2% to 50%. If the proportion of the hydrogen gas is less than 0.2%, the effect of activating the migration of reactive species on the substrate can not be sufficiently obtained, which makes it difficult to laminate a Group III nitride semiconductor having excellent crystallinity. Moreover, if the proportion of the hydrogen gas exceeds 50%, too much hydrogen is taken into the formed Group III nitride semiconductor, which may serve as a causative factor of inhibition against the activation of the acceptor impurity.

In addition, in order to efficiently sputter the target 47, it is more preferable to mix the atmosphere with a low-reactive inert gas of large molecular weight such as argon (Ar).

In such a case, the flow rate ratio of nitrogen gas ($N_2$) to argon (Ar) can be set, for example, within a range of 0.25 to 50. If the ($N_2$/Ar) ratio is lower than 0.25, the sputtering raw material may remain adhered in the form of metal. If the ($N_2$/Ar) ratio is higher than 50, the argon amount is so little that the sputtering rate is lowered.

In addition, in order to laminate a Group III nitride semiconductor having particularly excellent crystallinity, preferably the ($N_2$/Ar) ratio in the atmosphere in the chamber 41 is set within a range of 0.25 to 4 and the balance made of a gas containing an inert gas. By so doing, the Group III nitride semiconductor can be grown in an atmosphere rich in the Group III raw material, and thus a Group III nitride semiconductor having more excellent crystallinity can be grown.

As described above, the balance except for the nitrogen atom-containing gas and the hydrogen gas in the gas atmosphere in the chamber 41 preferably is made of an inert gas. Since such an inert gas is used for the purpose of efficient sputtering of the target, it is preferable to use Ar or the like whose reactivity is low and whose weight is large. Moreover, additional gas components can also be added into the gas atmosphere, to a degree not to inhibit the actions of the nitrogen atom-containing gas, the hydrogen gas, and the inert gas.

The temperature of the substrate 11 in the film formation step of the present embodiment is preferably set within a range of 300° C. to 1200° C.

As a result of intensive studies conducted by the inventors of the present invention, it has been revealed that generally the substrate temperature is set preferably within a range of 300° C. to 1200° C. so as to form a semiconductor layer composed of a Group III nitride semiconductor having excellent crystallinity by a sputtering method. If the substrate temperature is lower than 300° C., migration of reactive species on the surface of the substrate is suppressed, which makes it difficult to form a Group III nitride semiconductor having excellent crystallinity. In addition, if the substrate temperature exceeds 1200° C., the formed Group III nitride semiconductor may be decomposed again.

Moreover, in order to control the conductivity to p-type by doping with Mg, the substrate temperature is more preferably set within a range of 600° C. to 1050° C. By setting the substrate temperature within a range of 600° C. to 1050° C., a Group III nitride semiconductor having a lower defect density of point defects or the like and excellent crystallinity can be grown. By so doing, the conductivity of the Group III nitride semiconductor can be controlled to p-type by doping with Mg.

The film formation rate of the semiconductor thin film composed of a Group III nitride semiconductor in the film formation step with the sputtering method of the present embodiment is preferably set at 0.01 to 10 nm/second. If the film formation rate exceeds 10 nm/second, hydrogen may not be eliminated even by the plasma treatment. In addition, if it is lower than 0.01 nm/second, the process wastefully takes a long time, and the application to industrial production becomes difficult.

Moreover, the thickness of the Mg-doped semiconductor thin film formed in the film formation step is preferably set within a range of 1 to 100 nm per each film formation treatment of the film formation step. Then, by laminating the semiconductor thin film through alternate repetitions of the film formation step for forming a semiconductor thin film in this thickness and the plasma treatment step, details of which will be described later, eventually the Group III nitride semiconductor (p-type semiconductor layer 16) having a predetermined thickness, for example, a thickness of about 1000 nm (1 μm) at its maximum, is formed.

The plasma treatment step, which will be described later, provided in the sputtering step of the present embodiment has an effect of removing hydrogen from the Mg-doped Group III nitride semiconductor crystal film. However, such a hydrogen removal effect can only be obtained within a film thickness depth of about 10 nm (0.01 μm) from the crystal film surface. If the thickness of the Mg-doped Group III nitride semiconductor is significantly greater than this film thickness, the effects of activating the dopant Mg and of improving the crystallinity of the present invention may be difficult to obtain. Accordingly, in the film formation step of the present embodiment, the film thickness per each film formation treatment is set within the above range upon formation of the semiconductor thin film, so that each film thickness allows a maximum hydrogen removal effect by the plasma treatment. By so doing, the method is made capable of efficiently removing hydrogen from the formed crystal film.

In the film formation step of the present embodiment, in order to activate the migration of reactive species on the surface of the substrate 11 during the growth of crystal, a bias to be applied to the substrate 11 side and a power to be applied to the target 47 side are preferably greater. For example, the bias to be applied to the substrate 11 side upon film formation is preferably 1.5 W/cm$^2$ or greater, and the power to be applied to the target 47 side upon film formation is preferably set within a range of 1.5 W/cm$^2$ to 5 kW/cm$^2$.

The composition of the semiconductor layer composed of a Group III nitride semiconductor formed in the film formation step of the present embodiment can be controlled by adjusting the composition of the Group III metal used as the target at a desired value. For example, a Ga metal may be used as the target upon formation of a layer made of GaN, and an AlGa alloy may be used as the target upon formation of an AlGaN layer.

Moreover, an InGa alloy may be used upon formation of an InGaN layer. Since the composition of the Group III nitride semiconductor can be changed according to the composition of the Group III metal of the target 47, a semiconductor layer composed of a Group III nitride semiconductor at a desired composition can be formed by experimentally determining the composition of the target 47.

Alternatively, for example, for laminating an AlGaN layer, both a Ga metal and an Al metal may be provided together as the target. In this case, the composition of the AlGaN layer to be laminated can be controlled by changing the ratio of the surface area between the Ga metal target and the Al metal target. Similarly, for laminating an InGaN layer, both a Ga metal target and an In metal target may be provided together.

In addition, the Group III nitride semiconductor may be doped with Mg (p-type impurity) by using a mixture target prepared by mixing a Group III metal and an acceptor impurity. For example, upon formation of Mg-doped GaN by a sputtering method, a mixture target containing Ga metal and Mg is used. In this case, the Mg-doped GaN can be formed by preparing a solid-state solution of solid Ga metal with Mg and using this Mg-containing Ga metal solid solution as the target. Moreover, small pieces of Ga metal and Mg may be separately provided for use as the target. In this case, GaN having a desired impurity concentration can be formed by experimentally determining the proportion between Ga and Mg serving as the target. For example, when a solid-state solution of solid Ga with Mg is used as the target, the p-type single crystal GaN layer (p-type semiconductor layer 16) having a carrier concentration of $1\times10^{18}$ cm$^{-3}$ to $1\times10^{16}$ cm$^{-3}$ can be formed by setting the weight ratio of Mg to Ga within a range of 1 (Ga): 0.05 to 0.0005 (Mg).

The method for doping Mg into the Group III nitride semiconductor is not limited to the above method, and other methods can also be used.

Moreover, as described above, as the p-type impurity, not only Mg but also, for example, zinc (Zn) can be used in the same manner.

(Plasma Treatment Step)

The plasma treatment step provided in the sputtering step of the present embodiment is a substep for applying an inert gas plasma treatment to the Mg-doped semiconductor thin film that has been formed on the light-emitting layer 15 in the film formation step as described above. By performing the plasma treatment step of the present embodiment, hydrogen can be effectively removed from the formed Mg-doped semiconductor thin film. Preferably, the hydrogen concentration is $1\times10^{16}$ cm$^{-3}$ or lower.

As the inert gas for applying the plasma treatment to the Mg-doped semiconductor thin film, either a single component gas or a mixed gas having several types of components may be used. As such an inert gas for use in the plasma treatment, for example, any one or more types selected from He, Ne, Ar, Kr, and Xe may be used.

Moreover, the plasma treatment with such an inert gas is suitably performed by a reverse sputtering method. In the plasma treatment step of the present embodiment, plasma efficiently act on the Mg-doped semiconductor thin film by applying a voltage between the substrate 11 and the chamber.

In addition, the plasma treatment step of the present embodiment may also be performed in a plasma containing a gas which generates active plasma species, such as nitrogen, besides the abovementioned inert gas. In this case, the nitrogen content in the gas is preferably suppressed to 50% or lower, in terms of prevention against deterioration of the film.

In the plasma treatment step of the present embodiment, the power for generating an inert gas plasma in the chamber 41 is preferably set within a range of 10 to 5000 W, and more preferably 20 to 500 W. If the power value is within this range, hydrogen can be efficiently removed from the Mg-doped semiconductor thin film.

In addition, in the present embodiment, the plasma for use in the plasma treatment is preferably generated through RF discharge. By generating the plasma through RF discharge, the plasma treatment can be efficiently applied to the Mg-doped semiconductor thin film.

In the plasma treatment step of the present embodiment, the pressure in the chamber 41 is preferably within a range of $1\times10^{-5}$ to 10 Pa, and more preferably 0.01 to 1 Pa. If the pressure in the chamber 41 is too high, the energy of plasma is lowered to weaken the effect of the plasma treatment on the Mg-doped semiconductor thin film as mentioned above. In addition, if the pressure in the chamber 41 is too low, the energy of plasma is so high that the Mg-doped semiconductor thin film may be damaged.

The duration of the plasma treatment step preferably within a range of 1 second to 600 seconds (10 minutes). Needless to say, if the treatment duration is shorter than the above range, the effect of the plasma treatment can not be obtained. In addition, if the treatment duration is longer than the above range, the characteristics will not be exceptionally improved, but rather concern of lowering the operating ratio may be brought about.

The temperature for performing the plasma treatment step, that is, the temperature of the substrate 11 is preferably within a range of room temperature to 800° C. If the treatment temperature in the plasma treatment step is too low, the hydrogen removal effect of the plasma treatment can not be sufficiently obtained. In addition, if the treatment temperature is too high, the surface of the Mg-doped semiconductor thin film or the substrate may be damaged. Moreover, the treatment temperature in the plasma treatment step is more preferably within a range of 300° C. to 800° C.

As the chamber for use in the plasma treatment step of the present embodiment, the chamber 41 may be used by replacing the internal atmosphere gas using the sputtering apparatus 40 that has been used in the abovementioned film formation step, or another chamber may also be used. It is preferable to use a common sputtering apparatus for both the film formation step and the plasma treatment step, in terms of cost reduction in the manufacturing facility. Moreover the loss time in the steps can be reduced, and the operating ratio improved, if the film formation step and the plasma treatment step are alternately and repeatedly performed.

In the manufacturing method of the present embodiment, by providing the abovementioned plasma treatment step, hydrogen can be effectively removed from the Mg-doped semiconductor thin film (Group III nitride semiconductor) through the inert gas plasma treatment.

As shown in the schematic diagram of FIG. 6, the Mg-doped semiconductor thin film A formed by the film formation step is being formed while containing hydrogen from the atmosphere gas in the chamber (refer to (a) Film formation step in FIG. 6). Then, by applying the inert gas plasma treatment to this semiconductor thin film A, hydrogen is removed from the semiconductor thin film A to form the Mg-doped semiconductor thin film B (refer to (b) Plasma treatment step in FIG. 6). In this manner, by removing hydrogen from the Mg-doped semiconductor thin film, Mg being used as a dopant is activated, and hence the p-type semiconductor layer 16 can be formed in a state where Mg within the layer is activated.

In addition, by providing the method with the plasma treatment step of the present embodiment, the Mg doped in the Group III nitride semiconductor is activated. Therefore, even if the Mg-dopant content in the p-type semiconductor layer 16 to be formed is reduced, excellent p-type characteristics can be obtained. In this manner, if the Mg-dopant content in the p-type semiconductor layer 16 is reduced, it becomes possible to form the p-type semiconductor layer 16 having more excellent crystallinity.

Moreover, by providing the plasma treatment step of the present embodiment, even if a hydrogen-rich gas is used as the atmosphere gas in the film formation step, hydrogen can be effectively removed from the Group III nitride semiconductor in the subsequent plasma treatment step. By so doing, on completion of formation of the Mg-doped semiconductor thin film having high crystallinity in the hydrogen-containing gas atmosphere in the film formation step, hydrogen can be removed in the plasma treatment step so as to form the Mg-doped semiconductor thin film having activated Mg dopant. Accordingly, the p-type semiconductor layer 16 having excellent p-type characteristics and excellent crystallinity can be formed.

In conventional methods in which a formed Mg-doped Group III nitride semiconductor (p-type semiconductor layer) is annealed to thereby remove hydrogen for Mg activation, it has been difficult to efficiently remove hydrogen and there has been a problem in that $\frac{1}{10}$ to $\frac{1}{5}$ of Mg contained in the crystal are unactivated. With respect to this, in the present embodiment, by the method provided with the plasma treatment step as described above, Mg that has been doped into the Group III nitride semiconductor can be highly efficiently activated.

(Repetition of Film Formation Step and Plasma Treatment Step)

The sputtering step of the present embodiment is a method to form the p-type semiconductor layer 16 composed of a Mg-doped Group III nitride semiconductor by laminating semiconductor thin films through alternate repetitions of the film formation step and the plasma treatment step as mentioned above.

Although it is possible to remove hydrogen in the Group III nitride semiconductor formed on the substrate by the plasma treatment in the plasma treatment step as mentioned above, such a hydrogen removal effect can only be obtained within a film thickness depth of about 10 nm (0.01 μm) from the surface of the Group III nitride semiconductor. For example, if the Group III nitride semiconductor layer has a thickness of more than 10 nm, the hydrogen removal effect can be obtained in the vicinity of its surface whereas the effect can not be obtained deep inside the layer apart from the surface.

Therefore, the sputtering step of the present embodiment is a method to alternately and repeatedly perform the film formation step and the plasma treatment step. For example, firstly, a Mg-doped semiconductor thin film is formed with a thickness of 10 nm in the film formation step, and subsequently the plasma treatment is applied thereto to remove hydrogen in the plasma treatment step. Then, additional semiconductor thin films are laminated through alternate repetitions of the film formation step and the plasma treatment step as mentioned above, whereby the Mg-doped Group III nitride semiconductor is formed with a desired thickness so that the p-type semiconductor layer 16 can be obtained (also refer to the schematic diagram of FIG. 6). In such a manner, by taking the film formation step through repetitive formation of a semiconductor thin film having a thin film thickness and repetitive application of a plasma treatment to the Mg-doped semiconductor thin film to efficiently remove hydrogen, even if a Mg-doped Group III nitride semiconductor having a thick film thickness is eventually formed, hydrogen can be highly efficiently removed from the entire semiconductor layer.

The sputtering step of the present embodiment is preferably performed within a range of 1 to 1000 times of alternate repetitions of the abovementioned film foil ration step and plasma treatment step. The number of times of the repetitions can be appropriately set according to the desired film thickness of the Mg-doped Group III nitride semiconductor (p-type semiconductor layer) and the film thickness per each film formation treatment in the film formation step.

In the sputtering step of the present embodiment, an interval within a range of 1 to 300 seconds (5 minutes) is preferably provided between the film formation step and the plasma treatment step to be alternately repeated. By providing a predetermined time interval between the film formation step and the plasma treatment step, for example, if a hydrogen-containing gas atmosphere is filled in the chamber 41 in the film formation step, hydrogen in the chamber 41 can be eliminated to the outside prior to the initiation of the sputtering step so that the hydrogen removal treatment in the sputtering step can be more effectively performed.

In addition, the sputtering step of the present embodiment may be provided with an adjustment step for changing at least any one treatment condition in the film formation step or the plasma treatment step, between the film formation step and the plasma treatment step to be alternately repeated.

If the abovementioned adjustment step is provided in the sputtering step, this adjustment step may be set to be a step for changing at least any one treatment condition amongst a treatment duration or a substrate temperature in the film formation step, or a power, a treatment duration, a substrate temperature, or a pressure in the chamber in the plasma treatment step, or the like. By setting in such a manner, treatment conditions can be promptly and precisely changed according to the situation of the film formation step and the plasma treatment step, so that the yield and the productivity can be improved.

In the sputtering step of the present embodiment, the p-type semiconductor layer 16 composed of a Mg-doped Group III nitride semiconductor is formed through repetition of the abovementioned film formation step and plasma treatment step. As described above, the p-type semiconductor layer 16 formed in such a sputtering step preferably has a thickness within a range of 0.05 to 1 μm, and preferably has a Mg (acceptor impurity) dopant concentration within a range of $1 \times 10^{18}$ to $5 \times 10^{21}$/cm$^3$, and more preferably $1 \times 10^{19}$ to $5 \times 10^{20}$/cm$^3$. In addition, the p-type semiconductor layer 16 formed in the above sputtering step preferably has a hydrogen concentration of $1 \times 10^{16}$ cm$^{-3}$ or lower.

(Sputtering Apparatus)

When a semiconductor layer composed of a Group III nitride semiconductor is formed by a sputtering method as with the manufacturing method of the present embodiment, a reactive sputtering method is generally employed in which a Group III metal is used as a target, and a nitrogen-containing gas (nitrogen gas: $N_2$, ammonia: $NH_3$, or the like) is introduced into a chamber of a sputtering apparatus to effect reaction between the Group III metal and nitrogen in the vapor phase. As the sputtering method, RF sputtering and DC sputtering may be enumerated. However, when a reactive sputtering method is employed as with the manufacturing method according to the present invention, DC sputtering which brings about continuous discharging causes severe electrification, which makes it difficult to control the film formation rate. Accordingly, in the manufacturing method according to the present invention, amongst the RF sputtering method and the DC sputtering method, it is preferable to employ pulsed DC sputtering which is capable of providing a pulsed bias, and it is preferable to employ a sputtering apparatus capable of processing by such a sputtering method.

In addition, when the RF sputtering is employed, the position of a magnet is preferably moved in the target as a method for avoiding electrification. The specific moving method can be selected according to the sputtering apparatus to be used. The movement can include swinging, rotation, and the like.

In the sputtering apparatus 40 exemplified in FIG. 5, a magnet 42 is provided underneath the target 47 so that this magnet 42 can be rotated underneath the target 47.

When a semiconductor layer composed of a Group III nitride semiconductor is formed by sputtering, reactive species of higher energy are preferably supplied to the substrate. For this reason, the structure in the sputtering apparatus is preferably such that the substrate 11 is positioned in the plasma and the target 47 and the substrate 11 are in a positional relation facing each other. Moreover, the distance between the substrate 11 and the target 47 is preferably set within a range of 10 to 100 mm.

In addition, since it is preferable to leave as few impurities as possible in the chamber 41, the ultimate vacuum of the sputtering apparatus 40 is preferably $1.0 \times 10^{-3}$ Pa or less.

Moreover, in the manufacturing method of the present embodiment, the film formation step and the plasma treatment step provided in the sputtering step may be performed in the same sputtering apparatus. In this case, a predetermined time interval may be provided between the film formation step and the plasma treatment step, so as to replace the atmosphere gas in the chamber 47 during that interval.

According to the method for manufacturing a Group III nitride semiconductor of the present embodiment as described above, upon formation of the p-type semiconductor layer 16 composed of a Mg-doped Group III nitride semiconductor by a sputtering method, the Group III nitride semiconductor is formed through alternate repetitions of the film formation step for forming a semiconductor thin film while doping with Mg, and the plasma treatment step for applying an inert gas plasma treatment to the semiconductor thin film that has been formed in the film formation step. Therefore, hydrogen can be efficiently eliminated from the Mg-doped Group III nitride semiconductor, so as to grow the Group III nitride semiconductor in which the Mg dopant is activated. In addition, since Mg in the semiconductor layer is activated, the amount of the Mg dopant can be reduced, in which case, a Group III nitride semiconductor having more excellent crystallinity can be obtained. Therefore, a Group III nitride semiconductor light-emitting device having excellent light emission characteristics can be produced using a sputtering method which excels in the mass productivity and the reproductivity, without the need for facilities such as for an annealing step for eliminating hydrogen.

Moreover, if a Mg-doped semiconductor thin film having high crystallinity is formed while circulating a hydrogen-containing gas and a nitrogen-containing gas in the chamber 41 in the film formation step, and if an inert gas plasma treatment is applied to the Mg-doped semiconductor thin film in the subsequent plasma treatment step, then it becomes possible to obtain both excellent crystallinity by performing the film formation step in the hydrogen-containing gas atmosphere, and a Mg activation effect by the hydrogen removal effect of the plasma treatment step.

The Group III nitride semiconductor whose conductivity has been controlled to p-type by doping with a p-type impurity according to the present invention can be used for various semiconductor devices including p-type semiconductor layers to be provided in light-emitting devices such as a light emitting diode (LED), details of which will be described later, and a laser diode (LD), and electronic devices such as a transistor.

[Method for Manufacturing a Group III Nitride Semiconductor Light-Emitting Device]

Figure 3:
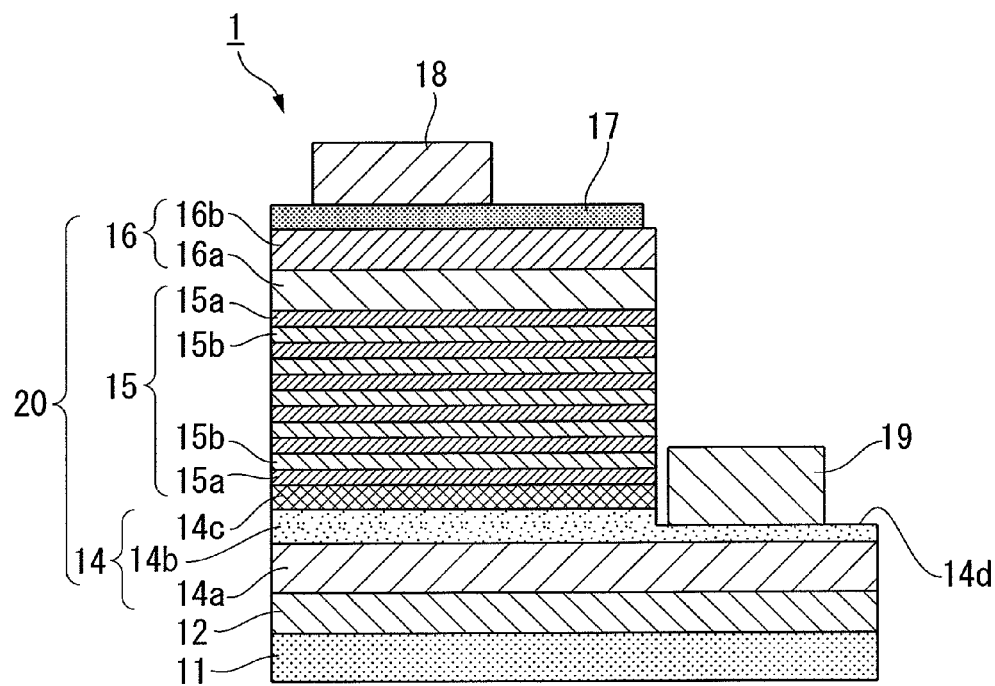
FIG. 3 is a schematic diagram for explaining an example of the Group III nitride semiconductor according to the present invention, showing a cross-sectional structure of the light-emitting device constituted by the Group III nitride semiconductor.

The method for manufacturing a Group III nitride semiconductor light-emitting device according to the present invention is a method as exemplified in FIG. 3 (also refer to FIG. 1) which comprises a semiconductor layer 20 having the n-type semiconductor layer 14, the light-emitting layer 15, and the p-type semiconductor layer 16 respectively composed of Group III nitride semiconductors and sequentially laminated, and in which at least a part of the p-type semiconductor layer 16 is doped with Mg, wherein at least a part of the p-type semiconductor layer 16 is formed by the method for manufacturing a Group III nitride semiconductor as mentioned above.

<Laminated Structure of Light-Emitting Device>

Figure 2:
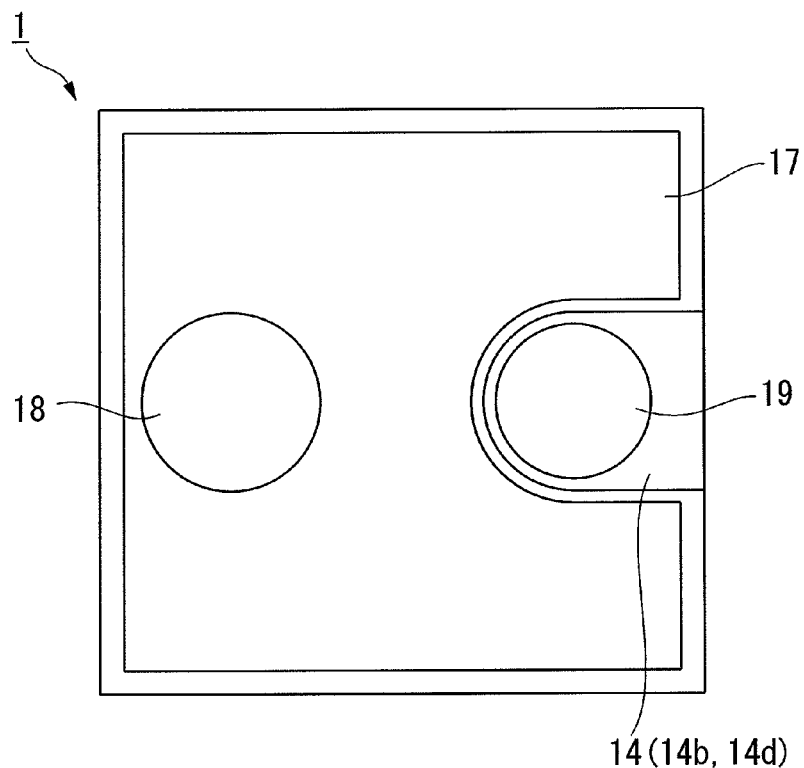
FIG. 2 is a schematic diagram for explaining an example of the Group III nitride semiconductor according to the present invention, showing a planar structure of a light-emitting device constituted by the Group III nitride semiconductor.

FIG. 2 and FIG. 3 are schematic diagrams for explaining an example of the light-emitting device of the present embodiment, showing an example in which a light-emitting device 1 is constituted by using the laminated semiconductor 10 (refer to FIG. 1) in which respective layers composed of Group III nitride semiconductors are formed on a substrate. FIG. 2 is a plan view and FIG. 3 is a cross-sectional view.

The light-emitting device 1 of the present embodiment schematically comprises a transparent positive electrode 17 laminated on the p-type semiconductor layer 16 of the laminated semiconductor 10 that has been produced by the above manufacturing method, a positive electrode bonding pad 18 formed thereon, and a negative electrode 19 laminated on an exposed area 14d that has been formed in the n-type contact layer 14b of the n-type semiconductor layer 14.

Moreover, the p-type semiconductor layer 16 of the present embodiment comprises a Mg-doped Group III nitride semiconductor formed by the above manufacturing method.

[Transparent Positive Electrode]

The transparent positive electrode 17 is a transparent electrode formed on the p-type semiconductor layer 16 (p-type contact layer 16b) of the laminated semiconductor 10 mentioned above.

The material of the transparent positive electrode 17 is not particularly limited, and materials such as ITO ($In_2O_3$—$SnO_2$), AZO (ZnO—$Al_2O_3$), IZO ($In_2O_3$—ZnO), and GZO (ZnO—$Ga_2O_3$) can be used through a commonly used means which is well known in this technological field. In addition, the structure thereof may employ any structure including conventionally well known structures without any limitations.

Moreover, the transparent positive electrode 17 may be either formed to cover substantially all over the surface of the Mg-doped p-type semiconductor layer 16 or formed in a lattice shape or branching shape by having spaces.

[Positive Electrode Bonding Pad and Negative Electrode]

The positive electrode bonding pad 18 is an electrode formed on the abovementioned transparent positive electrode 17.

As the material of the positive electrode 18, various structures using Au, Al, Ni, Cu, and the like are well known. These well known materials and structures may be employed without any limitation.

The thickness of the positive electrode bonding pad 18 is preferably within a range of 100 to 1000 nm. Moreover, in terms of the characteristics of the bonding pad, the thickness is preferably larger since the bondability becomes higher. Therefore, the thickness of the positive electrode bonding pad 18 is more preferably 300 nm or more. Furthermore, the thickness is preferably 500 nm or less in terms of the production cost.

The negative electrode 19 is formed to be in contact with the n-type contact layer 14b of the n-type semiconductor layer 14, in the semiconductor layer in which the n-type semiconductor layer 14, the light-emitting layer 15, and the p-type semiconductor layer 16 have been sequentially laminated on the substrate 11.

Therefore, for forming the negative electrode 19, the p-type semiconductor layer 16, the light-emitting layer 15, and the n-type semiconductor layer 14 are partially removed to thereby expose the exposed area 14d in the n-type contact layer 14b, on which the negative electrode 19 is formed.

As the material of the negative electrode 19, negative electrodes of various compositions and structures are well known. These well known negative electrodes may be employed without any limitation, and can be provided through a commonly used means which is well known in this technical field.

<Method for Manufacturing Light-Emitting Device>

Hereunder is a description of an example of the method for manufacturing the light-emitting device 1 as shown in FIG. 2 and FIG. 3.

The method for manufacturing the light-emitting device 1 of the present embodiment is a method in which, using the laminated semiconductor 10 that has been obtained by the above manufacturing method, the transparent positive electrode 17 is laminated on the p-type semiconductor layer 16 of the concerned laminated semiconductor 10, the positive electrode bonding pad 18 is formed thereon, and the negative electrode 19 is laminated on the exposed area 14d that has been formed in the n-type contact layer 14b of the n-type semiconductor layer 14.

[Formation of Transparent Positive Electrode]

By the abovementioned method, the transparent positive electrode 17 made of ITO is formed on the p-type contact layer 16b of the laminated semiconductor 10 in which the buffer layer 12 and the semiconductor layer have been laminated on the substrate 11.

The method for forming the transparent positive electrode 17 is not particularly limited, and it can be provided through a commonly used means which is well known in this technological field. In addition, the structure thereof may employ any structure including conventionally well known structures without any limitations.

Moreover, as mentioned above, the material of the transparent positive electrode 17 is not limited to ITO, and it is possible to form this using materials such as AZO, IZO, and GZO.

Furthermore, after the formation of the transparent positive electrode 17, thermal annealing for the purpose of alloying or transparent finishing may be either applied or not applied.

[Formation of Positive Electrode Bonding Pad and Negative Electrode]

The positive electrode bonding pad 18 is further formed on the transparent positive electrode 17 that has been formed on the laminated semiconductor 10.

This positive electrode bonding pad 18 can be formed by laminating respective materials of Ti, Al, and Au, for example, from the surface side of the transparent positive electrode 17 through a conventionally well known method.

In addition, upon formation of the negative electrode 19, firstly, the exposed area 14d (refer to FIG. 2 and FIG. 3) is formed in the n-type contact layer 14b by partially removing the p-type semiconductor layer 16, the light-emitting layer 15, and the n-type semiconductor layer 14 that has been formed on the substrate 11, by a method such as dry etching. Then, on this exposed area 14d, the negative electrode 19 of a quadruple layer structure can be formed by laminating respective materials of Ni, Al, Ti, and Au, for example, from the surface side of the exposed area 14d through a conventionally well known method.

Then, the wafer in which the transparent positive electrode 17, the positive electrode bonding pad 18, and the negative electrode 19 have been provided on the laminated semiconductor 10 in the abovementioned manner, is subjected to grinding and polishing on the backside of the substrate 11 to make a mirror-like plane, followed by cutting into a 350-μm-square piece, for example. By so doing, a light-emitting device chip (light-emitting device 1) can be formed.

According to the method for manufacturing a Group III nitride semiconductor light-emitting device of the present embodiment as described above, the method is to form at least a part of the p-type semiconductor layer 16 from a Mg-doped Group III nitride semiconductor by the above manufacturing method. Therefore, a Group III nitride semiconductor light-emitting device which comprises a p-type semiconductor layer 16 composed of a Group III nitride semiconductor having excellent crystallinity, and has excellent light emission characteristics, can be obtained.

[Lamp]

A lamp can be constituted through means well known to those skilled in the art by combining the Group III nitride semiconductor light-emitting device of the present invention as explained above with a phosphor. Hitherto, a technique of changing emission colors by combining a light-emitting device with phosphors has been known, and such techniques can be employed without any limitations.

For example, it becomes possible to emit light having a wavelength longer than that of a light-emitting device by properly selecting a phosphor, and further, it is also possible to provide a lamp which can emit white light by mixing a light emitting wavelength of the light-emitting device itself and a wavelength converted by a phosphor.

Moreover, the lamp may be used for any application, such as a bullet shape type for general use, a side view type for use in a back light for a portable display, and a top view type for use in an indicator.

Figure 4:
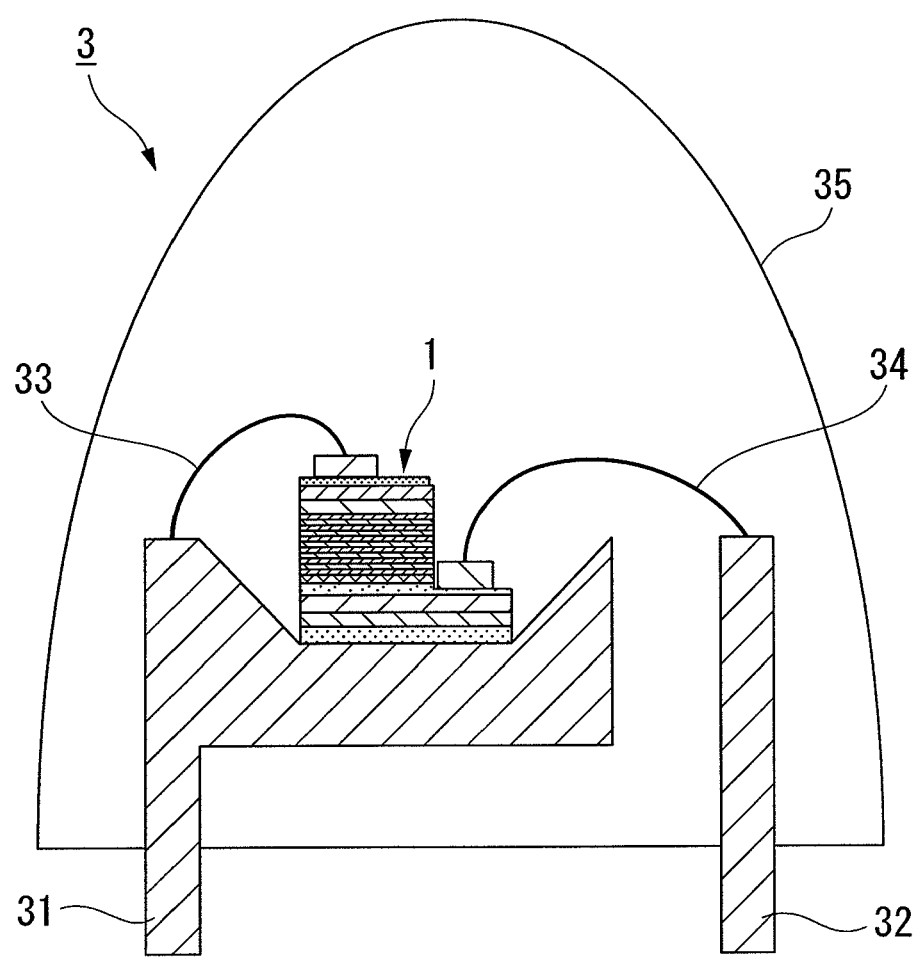
FIG. 4 is a schematic diagram for explaining a lamp constituted by using the Group III nitride semiconductor light-emitting device according to the present invention.

For example, as in the example shown in FIG. 4, when the Group III nitride semiconductor light-emitting device 1 of a type having electrodes on the same surface is to be mounted in a projectile shape: the light-emitting device 1 is bonded to either one of two frames (frame 31 in FIG. 4); a negative electrode of the light-emitting device 1 (refer to reference symbol 19 shown in FIG. 3) is connected to the frame 32 through a wire 34; and a positive electrode bonding pad of the light-emitting device 1 (refer to reference symbol 18 shown in FIG. 3) is connected to the frame 31 through a wire 33. Then, the surroundings of the light-emitting device 1 are molded with a mold 35 made of a transparent resin. By so doing, the projectile-shaped lamp 3 as shown in FIG. 4 can be produced.

In addition, the Group III nitride compound semiconductor whose conductivity has been controlled to p-type by doping with Mg according to the present invention, can be used for photoelectricity conversion devices such as a laser device and a photo acceptance device, or electronic devices such as HBT (Heterojunction Bipolar Transistor) and HEMT (High Electron Mobility Transistor), besides the abovementioned light-emitting device. Many various structures are known for these semiconductor devices, and the device structure of the laminated structure of the Group III nitride compound semiconductor according to the present invention includes such well known device structures and is not limited at all.

EXAMPLES

Next is a more detailed description of the method for manufacturing a Group III nitride semiconductor and the method for manufacturing a Group III nitride semiconductor light-emitting device of the present invention, with reference to Examples. It should be noted that the present invention is not to be limited to these examples.

Example 1

In the present example, a laminated semiconductor sample was produced by the following manner. On a substrate made of sapphire was laminated a buffer layer made of single crystal AlN using a sputtering method. A ground layer made of single crystal GaN was laminated thereon using a MOCVD method. Furthermore, a p-type GaN layer doped with an acceptor impurity was laminated thereon using a sputtering method.

[Formation of Buffer Layer]

At first, a sapphire substrate having a (0001) c plane of a diameter of two inches, the surface of which had been mirror finished, was washed with hydrofluoric acid or organic solvent, and was then introduced into a chamber of a sputtering apparatus (refer to reference symbol 41 in FIG. 5). Here, as the sputtering apparatus, there was employed an apparatus having a high frequency-type power supply, and a mechanism capable of moving a position influenced by the magnetic field, through rotation of a magnet within a target.

The substrate was heated to 500° C. in the chamber of the sputtering apparatus, into which a nitrogen gas was introduced at a flow rate of 15 sccm. Then, while keeping the pressure in the chamber at 1.0 Pa, and applying a high frequency bias of 50 W to the substrate, the substrate was thereby exposed to a nitrogen plasma to effect washing of the surface of the substrate.

Subsequently, an argon gas and a nitrogen gas were introduced into the chamber, and then the temperature of the substrate was lowered to 500° C. Under conditions where a high frequency power of 2000 W was applied to the metal Al target side, the pressure in the furnace was maintained at 0.5 Pa, the Ar gas was circulated at a flow rate of 5 sccm, and the nitrogen gas was circulated at a flow rate of 15 sccm (nitrogen ratio in the total gas was 75%), a buffer layer made of single crystal AlN was formed on the sapphire substrate. The growth rate at this time was 0.12 nm/s.

The magnet in the target was rotated at both timings of the substrate washing and the buffer layer formation. On completion of formation of the buffer layer made of AlN with a thickness of 50 nm in the above manner, the plasma operation was stopped. From the above procedure, the buffer layer made of single crystal AlN with a thickness of 50 nm was formed on the substrate.

[Formation of Ground Layer]

Subsequently, the substrate formed with the buffer layer was transferred into a chamber of a MOCVD apparatus, so as to grow a ground layer made of GaN by a MOCVD method. Then, under a condition where hydrogen was circulated in the chamber, the temperature of the substrate was raised to 1050° C. to effect sublimation and removal of contamination on the surface of the buffer layer. Moreover, on this occasion, from a time point when the temperature of the substrate reached 830° C. or higher, ammonia was circulated in the furnace.

Next, the temperature of the substrate was lowered to 1020° C. Then, while the circulation of ammonia was kept as it was in the chamber, a vapor of trimethylgallium (TMG) that had been generated by bubbling was circulated in the furnace to form the ground layer made of single crystal GaN with a thickness of 2 μm. Then, the TMG supply was stopped to stop growing GaN, followed by temperature reduction.

[Formation of P-Type GaN Layer (Sputtering Step)]

Subsequently, the substrate formed with the ground layer in the above manner was transferred into a chamber of a sputtering apparatus, so as to grow a p-type GaN layer (p-type semiconductor layer) on the substrate in the sputtering step. On this occasion, in the sputtering step, there was employed an apparatus, such as the sputtering apparatus 40 shown in FIG. 5, having a high frequency-type power supply, and a mechanism capable of moving a position influenced by the magnetic field using a magnet which sweeps across within the square Ga target. In addition, piping for circulating refrigerant was equipped in the Ga target, and a refrigerant cooled to 20° C. was circulated in the piping to prevent the fusion of Ga due to heat.

Moreover, for the Ga target mentioned above, a Mg-containing Ga metal solid solution was used. The ratio by weight of Mg with respect to Ga metal was set to about 1%.

In the sputtering step of the present example, as the film formation step serving as a substep, firstly a mixed gas made of argon, nitrogen, and hydrogen was introduced into the chamber of the sputtering apparatus, and then the temperature of the substrate was raised to 800° C. Under conditions where a high frequency bias of 2000 W was applied to the target side, the pressure in the furnace was maintained at 0.5 Pa, the Ar gas was circulated at a flow rate of 10 sccm, the nitrogen gas was circulated at a flow rate of 10 sccm, and the hydrogen gas was circulated at a flow rate of 10 sccm, a semiconductor thin film made of single crystal GaN was formed on the ground layer. The GaN growth rate at this time was set to approximately 100 nm/hr. On completion of formation of the thin film made of the Mg-doped single crystal GaN with a thickness of 5 nm, the plasma operation was stopped.

Next, as the gas to be circulated in the chamber 41, the gas of the above composition was replaced with an Ar gas alone at 10 sccm to perform the plasma treatment step. At this time, the plasma treatment was performed such that, while keeping the pressure in the chamber 41 at 0.5 Pa and applying a high frequency bias of 50 W to the substrate side, the substrate was thereby exposed to an inert gas plasma (reverse sputtering). In addition, at this time, the substrate temperature was set to 800° C. and the treatment duration was set to 4 seconds.

Then, on completion of the plasma treatment for the provided time duration as mentioned above, another film formation step under the above conditions was subsequently performed, followed by another plasma treatment step under the above conditions. The sputtering step was performed through 42 times of alternate repetitions of such film formation step and plasma treatment step, to laminate the semiconductor thin films. In this manner, the p-type GaN layer (p-type semiconductor layer) having a thickness of 210 nm was formed.

On completion of the sputtering step as mentioned above, the hydrogen concentration and the Mg-dopant amount in the p-type GaN layer on the substrate that had been taken out from the sputtering apparatus were analyzed by secondary ion mass spectrometry (SIMS), which showed that the hydrogen content was about $1 \times 10^{19}$ cm$^{-3}$ while the Mg-dopant amount was about $5 \times 10^{20}$ cm$^{-3}$.

Moreover, the p-type GaN layer formed in the sputtering step was subjected to a visual check, which showed that the surface was a transparent mirror plane. Furthermore, the GaN layer was subjected to Hall measurement, which showed that, without an annealing treatment for activating the p-type carrier, the p-type conductivity was exerted, the carrier concentration was about $5 \times 10^{17}$ cm$^{-3}$, and the mobility was satisfactory at about 10 cm$^2$/Vs. This can be attributed to Mg activation in the crystal due to improvement of the crystallinity of the p-type GaN layer.

Comparative Example 1

In Comparative Example 1, a sample in which a Mg-doped p-type single crystal GaN layer was laminated on the ground layer was formed under the same conditions as those of Example 1, except that, upon lamination of the Mg-doped GaN layer by the sputtering method, the abovementioned plasma treatment step was not provided but a p-type GaN layer (p-type semiconductor layer) having a thickness of 210 nm was formed by a continuous treatment in the film formation step.

On completion of the sputtering step as mentioned above, the hydrogen concentration and the Mg-dopant amount in the p-type GaN layer on the substrate that had been taken out from the sputtering apparatus were analyzed in the same manner as that of Example 1, which showed that the Mg-dopant amount was about $5 \times 10^{20}$ cm$^{-3}$ being comparable to that of Example 1 while the hydrogen content was about $5 \times 10^{20}$ cm$^{-3}$ being approximately the same as the Mg-dopant amount.

The obtained sample was subjected to a visual check, which showed that the surface of the laminated Mg-doped GaN layer was a transparent mirror plane. This Mg-doped GaN layer was subjected to Hall measurement; however, electrical measurement was not feasible. This can be attributed to a difficulty in the conductivity control by means of the Mg dopant due to low crystallinity of the GaN layer.

Example 2

In Example 2, a laminated semiconductor sample was formed by laminating a ground layer made of GaN on the substrate 11 and further laminating thereon a p-type GaN layer doped with an acceptor impurity by a sputtering method, in the same manner as that of Example 1, except that conditions for forming the buffer layer on the substrate 11 were controlled as described below, to thereby form a polycrystal structure as a columnar crystal aggregate made of AlN.

At this time, conditions differing from those as shown in Example 1 are that the substrate temperature was set to 750° C. and the pressure in the chamber was set to 0.08 Pa as conditions for exposing the surface of the substrate 11 to a nitrogen plasma to effect washing, and that the Ar gas flow rate was set to 15 sccm and the nitrogen gas flow rate was set to 5 sccm (the nitrogen ratio in the total gas amount was 25%) as conditions for forming the buffer layer made of AlN.

After the buffer layer in the form of a columnar crystal aggregate made of AlN had been formed on the substrate 11 by such a process, a ground layer made of single crystal GaN was formed with a thickness of 2 µm thereon, followed by further formation of a p-type GaN layer (p-type semiconductor layer) with a thickness of 210 nm.

Then, the hydrogen concentration and the Mg-dopant amount in the p-type GaN layer on the substrate that had been taken out from the sputtering apparatus were analyzed by secondary ion mass spectrometry (SIMS), which showed that the hydrogen content was about $1 \times 10^{19}$ cm$^{-3}$ while the Mg-dopant amount was about $5 \times 10^{20}$ cm$^{-3}$.

Moreover, the surface of the p-type GaN layer in the sample of Example 2 was subjected to a visual check, which showed that the surface was a transparent mirror plane. Furthermore, the GaN layer was subjected to Hall measurement, which showed that, without an annealing treatment for activating the p-type carrier, the p-type conductivity was exerted, the carrier concentration was about $5 \times 10^{17}$ cm$^3$, and the mobility was satisfactory at about 10 cm$^2$/Vs. This can be attributed to Mg activation in the crystal due to improvement of the crystallinity of the p-type GaN layer.

Example 3

In Example 3, a p-type GaN layer (p-type semiconductor layer) having a thickness of 210 nm was formed under the same conditions as those of Example 1, except that a high frequency bias of 5 W was applied to the substrate side within the treatment duration of the plasma treatment step.

On completion of the sputtering step as mentioned above, the hydrogen concentration and the Mg-dopant amount in the p-type GaN layer on the substrate that had been taken out from the sputtering apparatus were analyzed in the same manner as that of Example 1, which showed that the hydrogen content was about $1\times10^{20}$ cm$^{-3}$ and the Mg-dopant amount was about $5\times10^{20}$ cm$^{-3}$ being comparable to that of Example 1.

Moreover, the p-type GaN layer formed in the sputtering step was subjected to a visual check, which showed that the surface was a transparent mirror plane. Furthermore, the GaN layer was subjected to Hall measurement, which showed that, without an annealing treatment for activating the p-type carrier, the p-type conductivity was exerted, and the carrier concentration was as high as $3\times10^{17}$ cm$^3$. This can be attributed to Mg activation in the crystal due to improvement of the crystallinity of the p-type GaN layer, similarly to Example 1.

On the other hand, the sample of Example 3 showed a slightly lower carrier concentration as compared to the sample of Example 1. This can be attributed to lowering in the hydrogen removal effect by the plasma treatment as compared to Example 1, since the high frequency bias (power) applied to the substrate side was as low as 5 W in the plasma treatment step in Example 3.

Example 4

In the present example, a light emitting diode (LED) sample as shown in FIG. 2 and FIG. 3 was produced using a Mg-doped p-type AlGaN that had been laminated by a sputtering method. In the present example, firstly, the laminated semiconductor 10 as shown in FIG. 1 was formed by forming the buffer layer 12 by a sputtering method, the ground layer 14a by a MOCVD method, the n-type contact layer 14b by a sputtering method, and the n-type clad layer 14c and the light-emitting layer 15 by a MOCVD method, and by forming the p-type semiconductor layer 16 thereon by the sputtering step of the present invention.

[Formation of Buffer Layer and Ground Layer]

At first, the c plane of the sapphire substrate (substrate 11) was subjected to a pretreatment with a plasma using a first sputtering apparatus. Then, the buffer layer 12 made of single crystal AlN was formed by a RF sputtering method, and the ground layer 14a made of GaN was formed thereon in a MOCVD apparatus. At this time, the buffer layer 12 made of AlN and the ground layer 14a made of GaN were formed on the substrate 11 in the same manner as that of Example 1.

[Formation of N-Type Contact Layer]

Next, the substrate 11 formed with the ground layer 14a was transferred into a second sputtering apparatus, where the n-type contact layer 14b made of GaN was formed by a RF sputtering method. At this time, the n-type contact layer 14b was doped with Si.

Here, as the second sputtering apparatus for use in the GaN layer formation, there was employed a sputtering apparatus having a high frequency-type power supply, and a mechanism capable of moving a position influenced by the magnetic field using a magnet which sweeps across within the square Ga target. At this time, piping for circulating refrigerant was equipped in the Ga target, and a refrigerant cooled to 20° C. was circulated in the piping to prevent the fusion of Ga due to heat.

Subsequently, an argon gas and a nitrogen gas were introduced into the chamber, and then the temperature of the substrate was raised to 1000° C. Under conditions where a high frequency bias of 2000 W was applied to the metal Ga target side, the pressure in the furnace was maintained at 0.5 Pa, the Ar gas was circulated at a flow rate of 5 sccm, and the nitrogen gas was circulated at a flow rate of 15 sccm (nitrogen ratio in the total gas was 75%), the n-type contact layer 14b made of GaN was formed on the ground layer 14a. At this time, a Si target was also provided in the chamber, so that Si was taken into the vapor phase by simultaneous sputtering so as to dope Si into the GaN crystal serving as the n-type contact layer 14b. The growth rate at this time was about 1 nm/s. Then, on completion of formation of the n-type contact layer 14b made of GaN, the plasma operation was stopped.

From the above procedure, the n-type contact layer 14b made of Si-doped GaN having a thickness of 2 μm and an electron concentration of $1\times10^{19}$ cm$^{-3}$ was formed.

By the process as described above, the buffer layer 12 having a single crystal structure of AlN was formed on the sapphire substrate (substrate 11), on which the undoped GaN layer (n-type ground layer 14a) having a thickness of 2 μm and the Si-doped GaN layer (n-type contact layer 14b) having a carrier concentration of $1\times10^{19}$ cm$^{-3}$ were formed. The substrate taken out from the chamber after the film formation was colorless and transparent, and the surface of the GaN layer (n-type contact layer 14b in this case) was a mirror plane.

[Formation of N-Type clad Layer and Light-Emitting Layer]

The n-type clad layer 14c and the light-emitting layer 15 were laminated on the n-type contact layer 14b of the sample that had been produced by the above procedure, by a MOCVD method.

[Formation of N-Type clad Layer]

The substrate on which the n-type contact layer 14b made of Si-doped GaN had been grown was transferred into the chamber of the MOCVD apparatus. Then, under a condition where the atmosphere in the chamber was replaced with nitrogen, the temperature of the substrate was raised to 1000° C. to effect sublimation and removal of contamination on the outermost surface of the n-type contact layer 14b. Moreover, on this occasion, from a time point when the temperature of the substrate reached 830° C. or higher, ammonia was circulated in the furnace.

Next, the temperature of the substrate was lowered to 740° C. Then, while the circulation of ammonia was kept as it was in the chamber, a SiH$_4$ gas, a TMI vapor, and a TEG vapor that had been generated by bubbling were circulated in the furnace to form the n-type clad layer 14c made of Si-doped In$_{0.1}$Ga$_{0.9}$N with a thickness of 180 Å. Then, the supply of these raw materials was stopped by switching the valves for TMI, TEG, and SiH$_4$.

[Formation of Light-Emitting Layer]

Next, the light-emitting layer 15 having a multiquantum well structure composed of barrier layers 15a made of GaN and well layers 15b made of In$_{0.2}$Ga$_{0.8}$N was formed. Upon formation of this light-emitting layer 15, firstly a barrier layer 15a was formed on the n-type clad layer 14c made of Si-doped In$_{0.1}$Ga$_{0.9}$N, followed by formation of a well layer 15b made of In$_{0.2}$Ga$_{0.8}$N on this barrier layers 15a. After five times repetition of such a lamination procedure, a sixth barrier layer 15a was formed on a well layer 15b that had been laminated at the fifth time, to make a structure in which barrier layers 15a were disposed on both sides of the light-emitting layer 15 of a multiquantum well structure.

That is, on completion of growth of the n-type clad layer 14c made of Si-doped In$_{0.1}$Ga$_{0.9}$N, while the substrate temperature, the pressure in the furnace, and the flow rate and type of the carrier gas were kept as they were, the valve for TEG was switched to supply TEG into the furnace to thereby grow a barrier layer 15a made of GaN. By so doing, the barrier layer 15a having a thickness of 150 Å was formed.

Next, on completion of growth of the barrier layer 15a, while the temperature of the substrate 11, the pressure in the furnace, and the flow rate and type of the carrier gas were kept as they were, the valves for TEG and TMI were switched to supply TEG and TMI into the furnace to thereby grow a well layer 15b made of $In_{0.2}Ga_{0.8}N$. By so doing, the well layer 15b having a thickness of 20 Å was formed.

On completion of growth of the well layer 15b, another barrier layer 15a was grown. Then, such a procedure was repeated five times to thereby form five barrier layers 15a and five well layers 15b. Furthermore, another barrier layer 15a was formed on the top of the finally-laminated well layer 15b, to make the light-emitting layer 15.

[Formation of P-Type Semiconductor Layer]

The wafer that had been obtained by the respective treatments described above was transferred into a third sputtering apparatus, where a sputtering step was performed for forming the p-type semiconductor layer 16.

Here, as the sputtering apparatus for use in the sputtering step, there was employed a sputtering apparatus having a high frequency-type power supply, and comprising a rotating-type Ga target and Al target in the chamber. In addition, piping for circulating refrigerant was equipped in the Ga target, and a refrigerant cooled to 20° C. was circulated in the piping to prevent the fusion of Ga due to heat. Moreover, the Al target having a surface area proportion of about 1/10 as compared to the Ga target was used. By so doing, the composition of the AlGaN layer to be grown was adjusted to give $Al_{0.08}Ga_{0.92}N$.

Moreover, for the Ga target, a Mg-containing Ga metal solid solution was used. The ratio by weight of Mg with respect to Ga metal was set to about 1%.

Then, as the film formation step, firstly a mixed gas made of argon, nitrogen, and hydrogen was introduced into the chamber of the sputtering apparatus, and then the temperature of the substrate was raised to 800° C. Under conditions where a high frequency bias of 2000 W was applied to the Ga target, the pressure in the furnace was maintained at 0.5 Pa, the Ar gas was circulated at a flow rate of 10 sccm, the nitrogen gas was circulated at a flow rate of 10 sccm, and the hydrogen gas was circulated at a flow rate of 10 sccm, a semiconductor thin film made of Mg-doped AlGaN was formed. The growth rate of Mg-doped AlGaN at this time was set to approximately 100 nm/hr. On completion of formation of the Mg-doped AlGaN film with a thickness of 5 nm, the plasma operation was stopped.

Next, as the gas to be circulated in the chamber, the gas of the above composition was replaced with Ar gas alone at 10 sccm to perform the plasma treatment step. At this time, the plasma treatment was performed such that, while keeping the pressure in the chamber at 0.5 Pa and applying a high frequency bias (power) of 50 W to the substrate side, the substrate was thereby exposed to an inert gas plasma (reverse sputtering). In addition, at this time, the substrate temperature was set to 800° C. and the treatment duration was set to 4 seconds.

Then, on completion of the plasma treatment for the provided time duration as mentioned above, another film formation step under the above conditions was subsequently performed, followed by another plasma treatment step under the above conditions. The sputtering step was performed through 42 times of alternate repetitions of such a film formation step and plasma treatment step, to laminate the semiconductor thin films made of Mg-doped AlGaN. In this manner, the p-type semiconductor layer 16 made of Mg-doped $Al_{0.08}Ga_{0.92}N$ having a thickness of 210 nm was formed.

On completion of the sputtering step as mentioned above, the hydrogen concentration and the Mg-dopant amount in the p-type GaN layer on the substrate that had been taken out from the sputtering apparatus were analyzed by secondary ion mass spectrometry (SIMS), which showed that the hydrogen content was about $1 \times 10^{19}$ cm$^{-3}$ while the Mg-dopant amount was about $5 \times 10^{20}$ cm$^3$.

The p-type semiconductor layer 16 made of Mg-doped AlGaN obtained in the above process showed that, without an annealing treatment for activating the p-type carrier, the p-type conductivity was exerted, the carrier concentration was about $5 \times 10^{17}$ cm$^3$, and the mobility was satisfactory at about 10 cm$^2$/Vs.

As with the laminated semiconductor 10 as shown in FIG. 1, the epitaxial wafer for an LED, produced by the above manner, has a structure in which the MN layer (buffer layer 12) is formed on the substrate 11 made of sapphire having a c plane, followed by lamination of, sequentially from the substrate 11 side, the undoped GaN layer (ground layer 14a) with a thickness of 2 the Si-doped GaN layer (n-type contact layer 14b) having an electron concentration of $1 \times 10^{19}$ cm$^{-3}$ with a thickness of 2 the $In_{0.1}Ga_{0.9}N$ clad layer (n-type clad layer 14c) having an electron concentration of $1 \times 10^{18}$ cm$^{-3}$ with a thickness of 180 Å, the multiquantum well structure (light-emitting layer 15) composed of six GaN barrier layers (barrier layers 15a) with a thickness of 150 Å and five nondoped $In_{0.2}Ga_{0.8}N$ well layers (well layers 15b) with a thickness of 20 Å, being sandwiched by GaN barrier layers on both sides, and the Mg-doped AlGaN layer (p-type semiconductor layer 16) composed of a p-type clad layer 16a made of Mg-doped $Al_{0.1}Ga_{0.9}N$ with a thickness of 10 nm and a p-type contact layer 16b made of Mg-doped $Al_{0.02}Ga_{0.98}N$ with a thickness of 200 nm.

[Production of LED]

Subsequently, an LED was produced using the above epitaxial wafer (laminated semiconductor 10).

That is, on the surface of the Mg-doped AlGaN layer (p-type semiconductor layer 16b) of the abovementioned epitaxial wafer was formed a transparent electrode 17 made of ITO by a well known photolithographic method. A positive electrode bonding pad 18 (p electrode bonding pad) having a laminated structure of titanium, aluminum, and gold in this order, was formed thereon for use as a p-side electrode. Furthermore, the wafer was subjected to dry etching to expose an area to be fanned with an n-side electrode (negative electrode) of the n-type contact layer 14b. Then, on this exposed area 14d was formed a negative electrode 19 (n-side electrode) composed of a lamination of four layers of Ni, Al, Ti, and Au in this order. By such a procedure, on the wafer (refer to the laminated semiconductor 10 of FIG. 1) were formed the respective electrodes in the shapes as shown in FIG. 2.

Then, the wafer formed with the respective p-side and n-side electrodes by the abovementioned procedure was subjected to grinding and polishing on the backside of the substrate 11 made of sapphire to make a mirror-like plane. Then, the wafer was cut into a 350-μm-square chip, which was disposed on a lead frame so that the respective electrodes faced upward, and was connected to the lead frame by gold wires to produce a light-emitting device (refer to the lamp 3 of FIG. 4).

A forward current was applied to between the p-side and n-side electrodes of the light emitting diode produced by the above manner. As a result, the forward voltage at a current of 20 mA was 3.1 V. In addition, the emitting state was observed through the p-side transparent electrode 17, which showed that the emission wavelength was 460 nm and the emission output was 15 mW. Such characteristics of the light emitting diode were uniformly obtained in the light emitting diode produced from almost the entire surface of the thus produced wafer.

From the above results, it is apparent that the Group III nitride semiconductor according to the present invention has excellent device characteristics, and the Group III nitride semiconductor light-emitting device according to the present invention has excellent light emission characteristics.

INDUSTRIAL APPLICABILITY

The method for manufacturing a Group III nitride semiconductor of the present invention is capable of producing a Group III nitride semiconductor whose conductivity has been controlled to p-type by doping with Mg, by a sputtering method, and thus can be employed for the production of a p-type contact layer of a light emitting diode (LED) and a laser diode (LD), and various semiconductor devices including electronic devices such as FETs.

The invention claimed is:

1. A method for manufacturing a Group III nitride semiconductor, comprising
a sputtering step for disposing a substrate and a target in a chamber and forming a Mg-doped Group III nitride semiconductor on said substrate by a reactive sputtering method, wherein
said sputtering step includes respective substeps of: a film formation step for forming a semiconductor thin film while doping with Mg; and a plasma treatment step for applying an inert gas plasma treatment to the semiconductor thin film that has been formed in the film formation step, and
the Group III nitride semiconductor is formed by laminating said semiconductor thin film through alternate repetitions of said film formation step and said plasma treatment step.

2. The method for manufacturing a Group III nitride semiconductor according to claim 1, wherein
said Mg-doped semiconductor thin film is formed with a thickness within a range of 1 to 100 nm in said film formation step, and
the Group III nitride semiconductor is formed by laminating said semiconductor thin film through alternate repetitions of the film formation step within the above range of film thickness and said plasma treatment step in said sputtering step.

3. The method for manufacturing a Group III nitride semiconductor according to claim 1, wherein said film formation step is performed while circulating a hydrogen-containing gas and/or a nitrogen-containing gas in said chamber.

4. The method for manufacturing a Group III nitride semiconductor according to claim 3, wherein said nitrogen-containing gas is an ammonia gas.

5. The method for manufacturing a Group III nitride semiconductor according to claim 1, wherein a temperature of said substrate is set within a range of 300° C to 1200° C in said film formation step.

6. The method for manufacturing a Group III nitride semiconductor according to claim 1, wherein a power for generating an inert gas plasma in said chamber is within a range of 10 to 5000 W in said plasma treatment step.

7. The method for manufacturing a Group III nitride semiconductor according to claim 1, wherein a duration for said inert gas plasma treatment is within a range of 1 to 600 seconds in said plasma treatment step.

8. The method for manufacturing a Group III nitride semiconductor according to claim 1, wherein any one type or more selected from He, Ne, Ar, Kr, and Xe is used as the inert gas to be circulated in said chamber in said plasma treatment step.

9. The method for manufacturing a Group III nitride semiconductor according to claim 1, wherein a temperature of said substrate is set within a range of room temperature to 800° C in said plasma treatment step.

10. The method for manufacturing a Group III nitride semiconductor according to claim 1, wherein said plasma treatment step is performed under a pressure within a range of $1 \times 10^{-5}$ to 10 Pa in said chamber.

11. The method for manufacturing a Group III nitride semiconductor according to claim 1, wherein said semiconductor thin film is laminated within a range of 1 to 1000 times of alternate repetitions of said film formation step and said plasma treatment step, in said sputtering step.

12. The method for manufacturing a Group III nitride semiconductor according to claim 1, wherein an interval within a range of 1 to 300 seconds is provided between said film formation step and said plasma treatment step to be alternately repeated in said sputtering step.

13. The method for manufacturing a Group III nitride semiconductor according to claim 1, wherein an adjustment step for changing at least any one treatment condition of said film formation step or said plasma treatment step is provided between said film formation step and said plasma treatment step to be alternately repeated in said sputtering step.

14. The method for manufacturing a Group III nitride semiconductor according to claim 13, wherein said adjustment step is for changing at least any one treatment condition amongst a treatment duration or a substrate temperature in said film formation step, or a power, a treatment duration, a substrate temperature, or a pressure in the chamber in said plasma treatment step.

15. The method for manufacturing a Group III nitride semiconductor according to claim 1, wherein a step for forming a ground layer comprised of a Group III nitride semiconductor on said substrate is provided at least prior to said sputtering step.

16. A method for manufacturing a Group III nitride semiconductor light-emitting device which comprises a semiconductor layer having an n-type semiconductor layer, a light-emitting layer, and a p-type semiconductor layer respectively comprised of Group III nitride semiconductors and sequentially laminated, in which at least a part of said p-type semiconductor layer is doped with Mg,
the method comprising: forming at least a part of said p-type semiconductor layer by the method for manufacturing a Group III nitride semiconductor according to claim 1.

17. A Group III nitride semiconductor light-emitting device comprising: a semiconductor layer having an n-type semiconductor layer, a light-emitting layer, and a p-type semiconductor layer respectively comprised of Group III nitride semiconductors and sequentially laminated, in which at least a part of said p-type semiconductor layer is doped with Mg, wherein
at least a part of said p-type semiconductor layer is formed by the method for manufacturing a Group III nitride semiconductor according to claim 1.

18. The Group III nitride semiconductor light-emitting device according to claim 17, wherein a thickness of said p-type semiconductor layer is set within a range of 0.05 to 1 μm.

19. The Group III nitride semiconductor light-emitting device according to claim 17, wherein a Mg dopant concentration in said p-type semiconductor layer is set within a range of $1 \times 10^{19}$ to $5 \times 10^{20}$/cm$^3$.

20. The Group III nitride semiconductor light-emitting device according to claim 17, wherein a hydrogen concentration in said p-type semiconductor layer is set at $1 \times 10^{16}$/cm$^3$ or lower.

21. A lamp including a frame and comprising the Group III nitride semiconductor light-emitting device according to claim 17 bonded to said frame.

* * * * *